United States Patent
Adusumilli et al.

(10) Patent No.: US 10,685,888 B2
(45) Date of Patent: Jun. 16, 2020

(54) LOW RESISTANCE SOURCE-DRAIN CONTACTS USING HIGH TEMPERATURE SILICIDES

(71) Applicant: International Business Machines Corporation, Armonk, NY (US)

(72) Inventors: Praneet Adusumilli, Albany, NY (US); Hemanth Jagannathan, Niskayuna, NY (US); Christian Lavoie, Pleasantville, NY (US); Ahmet S. Ozcan, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 91 days.

(21) Appl. No.: 15/334,479

(22) Filed: Oct. 26, 2016

(65) Prior Publication Data
US 2018/0068903 A1 Mar. 8, 2018

Related U.S. Application Data

(63) Continuation of application No. 15/259,626, filed on Sep. 8, 2016.

(51) Int. Cl.
*H01L 21/8238* (2006.01)
*H01L 29/06* (2006.01)
(Continued)

(52) U.S. Cl.
CPC ......... *H01L 21/823814* (2013.01); *H01L 21/26513* (2013.01); *H01L 21/28512* (2013.01);
(Continued)

(58) Field of Classification Search
CPC ......... H01L 21/28052; H01L 21/28518; H01L 29/665
(Continued)

(56) References Cited

U.S. PATENT DOCUMENTS

| 4,670,768 A | 6/1987 | Sunami et al. |
| 4,971,655 A | 11/1990 | Stefano et al. |

(Continued)

OTHER PUBLICATIONS

Ortolland, C., et al., "Carbon-based thermal stabilization techniques for junction and silicide engineering for high performance CMOS periphery in memory applications", Proceedings of the Tenth International Conference on Ultimate Integration of Silicon, Mar. 18-20, 2009, pp. 1-4.

(Continued)

*Primary Examiner* — Jay C Kim
(74) *Attorney, Agent, or Firm* — Fleit Intellectual Property Law; Thomas S. Grzesik

(57) ABSTRACT

A semiconductor structure and a method for fabricating the same. The semiconductor structure includes at least one semiconductor fin disposed on a substrate. A disposable gate contacts the at least one semiconductor fin. A spacer is disposed on the at least one semiconductor fin and in contact with the disposable gate. Epitaxially grown source and drain regions are disposed at least partially within the at least one semiconductor fin. A first one of silicide and germanide is disposed on and in contact with the source region. A second one of one of silicide and germanide is disposed on and in contact with the drain region. The method includes epitaxially growing source/drain regions within a semiconductor fin. A contact metal layer contacts the source/drain regions. One of a silicide and a germanide is formed on the source/drain regions from the contact metal layer prior to removing the disposable gate.

10 Claims, 29 Drawing Sheets

(51) Int. Cl.
*H01L 21/3215* (2006.01)
*H01L 21/265* (2006.01)
*H01L 21/285* (2006.01)
*H01L 29/45* (2006.01)
*H01L 29/66* (2006.01)
*H01L 27/092* (2006.01)
*H01L 21/84* (2006.01)
*H01L 27/12* (2006.01)
*H01L 29/16* (2006.01)
*H01L 29/161* (2006.01)
*H01L 29/24* (2006.01)
*H01L 29/423* (2006.01)
*H01L 29/786* (2006.01)
*H01L 21/768* (2006.01)

(52) U.S. Cl.
CPC .. *H01L 21/28518* (2013.01); *H01L 21/28568* (2013.01); *H01L 21/3215* (2013.01); *H01L 21/823807* (2013.01); *H01L 21/823885* (2013.01); *H01L 21/845* (2013.01); *H01L 27/092* (2013.01); *H01L 27/0924* (2013.01); *H01L 27/1211* (2013.01); *H01L 29/0673* (2013.01); *H01L 29/161* (2013.01); *H01L 29/1608* (2013.01); *H01L 29/24* (2013.01); *H01L 29/42392* (2013.01); *H01L 29/45* (2013.01); *H01L 29/66545* (2013.01); *H01L 29/66742* (2013.01); *H01L 29/78618* (2013.01); *H01L 29/78642* (2013.01); *H01L 29/78696* (2013.01); *H01L 21/76843* (2013.01); *H01L 21/76855* (2013.01); *H01L 21/823821* (2013.01); *H01L 21/823871* (2013.01); *H01L 29/456* (2013.01)

(58) Field of Classification Search
USPC .................................. 257/77; 438/199, 212
See application file for complete search history.

(56) References Cited

U.S. PATENT DOCUMENTS

| | | | |
|---|---|---|---|
| 5,028,554 A | 7/1991 | Kita | |
| 5,073,519 A * | 12/1991 | Rodder | H01L 29/66666 257/386 |
| 5,352,631 A | 10/1994 | Sitaram et al. | |
| 5,369,055 A | 11/1994 | Chung | |
| 5,442,200 A | 8/1995 | Tischler | |
| 5,989,988 A | 11/1999 | Iinuma et al. | |
| 6,084,280 A | 7/2000 | Gardner et al. | |
| 6,323,525 B1 * | 11/2001 | Noguchi | H01L 21/2257 257/344 |
| 6,642,119 B1 | 11/2003 | Pelella et al. | |
| 6,861,684 B2 * | 3/2005 | Skotnicki | H01L 21/2807 257/288 |
| 6,943,407 B2 | 9/2005 | Ouyang et al. | |
| 7,037,829 B2 | 5/2006 | Iyer et al. | |
| 7,067,379 B2 * | 6/2006 | Wen | H01L 21/84 257/E21.415 |
| 7,166,528 B2 * | 1/2007 | Kim | H01L 21/0237 257/E21.106 |
| 7,268,049 B2 * | 9/2007 | Zhu | H01L 21/26586 257/E21.345 |
| 7,453,133 B2 * | 11/2008 | Lee | H01L 23/3192 257/377 |
| 7,456,471 B2 | 11/2008 | Anderson et al. | |
| 7,456,476 B2 * | 11/2008 | Hareland | H01L 29/42384 257/349 |
| 7,528,465 B2 | 5/2009 | King et al. | |
| 7,535,016 B2 * | 5/2009 | Furukawa | B82Y 10/00 257/20 |
| 7,585,710 B2 * | 9/2009 | Park | H01L 21/28525 257/330 |
| 7,700,451 B2 | 4/2010 | Cho | |
| 7,759,729 B2 * | 7/2010 | Bjoerk | B82Y 10/00 257/330 |
| 7,812,414 B2 * | 10/2010 | Hou | H01L 21/823835 257/412 |
| 7,825,003 B2 * | 11/2010 | Gauthier, Jr. | H01L 21/823807 257/E21.561 |
| 7,879,660 B2 * | 2/2011 | Booth, Jr. | H01L 21/823807 257/E21.633 |
| 7,947,546 B2 * | 5/2011 | Liu | H01L 21/823807 257/408 |
| 8,129,763 B2 * | 3/2012 | Bjoerk | H01L 29/0673 257/288 |
| 8,183,628 B2 * | 5/2012 | Masuoka | H01L 21/823807 257/255 |
| 8,196,024 B2 | 6/2012 | Asirvatham et al. | |
| 8,207,038 B2 | 6/2012 | Cheng et al. | |
| 8,241,976 B2 | 8/2012 | Masuoka et al. | |
| 8,310,013 B2 | 11/2012 | Lin et al. | |
| 8,319,293 B2 | 11/2012 | Masuoka et al. | |
| 8,471,343 B2 * | 6/2013 | Doris | H01L 21/7682 257/383 |
| 8,497,548 B2 * | 7/2013 | Masuoka | H01L 21/823885 257/329 |
| 8,557,692 B2 | 10/2013 | Tsai et al. | |
| 8,592,916 B2 * | 11/2013 | Khakifirooz | H01L 27/088 257/353 |
| 8,633,515 B2 * | 1/2014 | Orlowski | H01L 29/41791 257/192 |
| 8,642,434 B2 | 2/2014 | Liu et al. | |
| 8,722,498 B2 * | 5/2014 | Scheiper | H01L 21/823412 257/368 |
| 8,729,627 B2 * | 5/2014 | Cheng | H01L 21/823807 257/288 |
| 8,748,281 B2 | 6/2014 | Hoentschel et al. | |
| 8,835,263 B2 * | 9/2014 | Weijtmans | H01L 29/165 257/E21.398 |
| 8,847,401 B2 * | 9/2014 | Chen | H01L 23/5222 257/249 |
| 8,871,626 B2 * | 10/2014 | Basker | H01L 29/66795 257/192 |
| 8,946,028 B2 | 2/2015 | Chan et al. | |
| 8,999,800 B2 | 4/2015 | Khaja et al. | |
| 9,012,281 B2 * | 4/2015 | Suk | H01L 27/0922 438/233 |
| 9,012,956 B2 | 4/2015 | Flachowsky et al. | |
| 9,023,697 B2 | 5/2015 | Chan et al. | |
| 9,041,076 B2 * | 5/2015 | Guo | H01L 29/665 257/288 |
| 9,054,194 B2 | 6/2015 | Tung et al. | |
| 9,059,139 B2 | 6/2015 | Adam et al. | |
| 9,064,688 B2 | 6/2015 | Cheng et al. | |
| 9,087,922 B2 * | 7/2015 | Sun | H01L 21/823487 |
| 9,129,897 B2 * | 9/2015 | Pore | C23C 16/06 |
| 9,166,014 B2 | 10/2015 | Breil et al. | |
| 9,171,925 B2 * | 10/2015 | Kuo | H01L 29/66545 |
| 9,184,263 B2 * | 11/2015 | Cai | H01L 29/6681 |
| 9,276,116 B2 * | 3/2016 | Maeda | H01L 29/785 |
| 9,299,700 B2 * | 3/2016 | Park | H01L 29/0653 |
| 9,305,835 B2 * | 4/2016 | Alptekin | H01L 21/7682 |
| 9,324,830 B2 | 4/2016 | He et al. | |
| 9,324,866 B2 * | 4/2016 | Yu | H01L 21/823807 |
| 9,368,572 B1 * | 6/2016 | Cheng | H01L 29/7827 |
| 9,373,702 B2 | 6/2016 | Li et al. | |
| 9,379,011 B2 * | 6/2016 | Pore | H01L 21/76886 |
| 9,397,197 B1 | 7/2016 | Guo et al. | |
| 9,431,536 B1 | 8/2016 | Wu et al. | |
| 9,437,495 B2 * | 9/2016 | Lee | H01L 29/7833 |
| 9,443,962 B2 * | 9/2016 | Ching | H01L 29/66795 |
| 9,466,696 B2 * | 10/2016 | Mor | H01L 29/66628 |
| 9,490,332 B1 * | 11/2016 | Balakrishnan | H01L 29/41791 |
| 9,502,407 B1 * | 11/2016 | Anderson | H01L 29/78 |
| 9,515,172 B2 * | 12/2016 | Shin | H01L 29/66818 |
| 9,543,167 B2 * | 1/2017 | Anderson | H01L 29/045 |
| 9,543,438 B2 * | 1/2017 | Tsai | H01L 29/7848 |

(56) References Cited

U.S. PATENT DOCUMENTS

| | | | |
|---|---|---|---|
| 9,577,097 B2* | 2/2017 | Lee | H01L 29/7848 |
| 9,583,487 B2* | 2/2017 | Giles | H01L 29/785 |
| 9,595,524 B2* | 3/2017 | Anderson | H01L 21/845 |
| 9,607,838 B1 | 3/2017 | Lin et al. | |
| 9,627,378 B2 | 4/2017 | Ando et al. | |
| 9,634,141 B1 | 4/2017 | Wang et al. | |
| 9,640,667 B1 | 5/2017 | Balakrishnan et al. | |
| 9,647,116 B1* | 5/2017 | Lee | H01L 29/6653 |
| 9,660,083 B2* | 5/2017 | Liu | H01L 29/785 |
| 9,698,255 B2* | 7/2017 | Lu | H01L 21/31144 |
| 9,722,083 B2 | 8/2017 | Tsai et al. | |
| 9,735,016 B2 | 8/2017 | Cho | |
| 9,735,253 B1* | 8/2017 | Bi | H01L 29/66666 |
| 9,768,311 B2* | 9/2017 | Alper | H01L 29/78648 |
| 9,818,846 B2* | 11/2017 | Ho | H01L 29/66795 |
| 9,847,330 B2 | 12/2017 | Chang et al. | |
| 9,859,424 B2 | 1/2018 | Glass et al. | |
| 9,865,716 B2 | 1/2018 | Chuang et al. | |
| 9,871,121 B2* | 1/2018 | Xu | H01L 29/6681 |
| 9,876,016 B2 | 1/2018 | Steigerwald et al. | |
| 9,876,083 B2 | 1/2018 | Chi et al. | |
| 9,887,269 B2 | 2/2018 | Ching et al. | |
| 9,899,398 B1 | 2/2018 | Colinge et al. | |
| 9,911,824 B2 | 3/2018 | Ching et al. | |
| 9,935,199 B2 | 4/2018 | Ching et al. | |
| 9,997,631 B2 | 6/2018 | Yang et al. | |
| 9,997,633 B2 | 6/2018 | Hsiao et al. | |
| 10,011,920 B2* | 7/2018 | Hekmatshoar-Tabari | C30B 25/105 |
| 10,032,889 B2 | 7/2018 | Wann et al. | |
| 10,032,897 B2* | 7/2018 | Cao | H01L 29/7613 |
| 10,090,392 B2* | 10/2018 | Chen | H01L 29/41783 |
| 10,109,507 B2 | 10/2018 | Liu et al. | |
| 10,157,995 B2 | 12/2018 | Wang et al. | |
| 2004/0262681 A1* | 12/2004 | Masuoka | H01L 29/42384 257/335 |
| 2005/0035369 A1* | 2/2005 | Lin | H01L 21/823807 257/194 |
| 2007/0148939 A1 | 6/2007 | Chu et al. | |
| 2009/0050972 A1* | 2/2009 | Lindsay | H01L 21/823807 257/368 |
| 2009/0174002 A1* | 7/2009 | Ouyang | H01L 21/823807 257/369 |
| 2012/0112292 A1 | 5/2012 | Lavoie et al. | |
| 2012/0210932 A1* | 8/2012 | Hekmatshoar-Tabari | C30B 25/105 117/103 |
| 2012/0241816 A1 | 9/2012 | Flachowsky et al. | |
| 2013/0134506 A1* | 5/2013 | Yagishita | H01L 29/66545 257/330 |
| 2013/0260549 A1* | 10/2013 | Jagannathan | H01L 21/28518 438/592 |
| 2014/0001561 A1 | 1/2014 | Cheng et al. | |
| 2014/0065799 A1 | 3/2014 | Ahmed | |
| 2014/0065819 A1 | 3/2014 | Ahmed et al. | |
| 2014/0120678 A1 | 5/2014 | Shinriki et al. | |
| 2014/0203363 A1* | 7/2014 | Adam | H01L 29/66742 257/347 |
| 2014/0210011 A1 | 7/2014 | Baraskar et al. | |
| 2014/0306290 A1 | 10/2014 | Alptekin et al. | |
| 2015/0380489 A1* | 12/2015 | Chan | H01L 27/0886 257/192 |
| 2016/0133525 A1* | 5/2016 | Lee | H01L 29/665 438/589 |
| 2016/0133745 A1 | 5/2016 | Kittl et al. | |

OTHER PUBLICATIONS

Murarka, S., et al., "Refractory Silicides of Titanium and Tantalum for Low-Resistivity Gates and Interconnects", IEEE Journal of Solid-State Circuits, Aug. 1980, pp. 474-482, vol. SC-15, No. 4.

Yamaguchi, M., et al., "High-Temperature Structural Intermetallics" Acta Materiala, Jan. 2000, pp. 307-322, vol. 48, No. 1.

Eyal et al., "The effect of carbon on strain relaxation and phase formation in the Ti/Si1$_{2x2y}$Ge$_x$C$_y$/Si contact system", Applied Physics Letters, Jul. 1996, pp. 64-66, vol. 69, No. 1.

Murarka, S., "Refractory silicides for integrated circuits", Journal of Vacuum Science & Technology, Jul. 1980, vol. 17, No. 4, pp. 775-792.

MacGkaoutsan, V., et al., "Improved thermal stability of Ni-silicides on Si:C epitaxial layers", Microelectronic Engineering, Nov. 2007, pp. 2542-2546, vol. 84, No. 11.

Lee, R., et al., "Route to Low Parasitic Resistance in MuGFETs with Silicon-Carbon Source/Drain: Integration of Novel Low Barrier Ni(M)Si:C Metal Silicides and Pulsed Laser Annealing", Proceedings of the 2007 IEEE International Electron Devices Meeting, Dec. 10-12, 2007, pp. 1-4.

Lee, R., et al., "Nickel-Silicide:Carbon Contact Technology for N-Channel MOSFETs With Silicon-Carbon Source/Drain", IEEE Electron Device Letters, Jan. 2008, pp. 89-92, vol. 29, No. 1.

Ex Parte Quayle Office Action for U.S. Appl. No. 15/334,479 Oct. 24, 2019.

Non-Final Office Action for U.S. Appl. No. 15/855,078 dated Oct. 18, 2019.

* cited by examiner

US 10,685,888 B2

LOW RESISTANCE SOURCE-DRAIN CONTACTS USING HIGH TEMPERATURE SILICIDES

BACKGROUND OF THE INVENTION

The present invention generally relates to the field of semiconductors, and more particularly relates to forming contact silicide on semiconductor structures.

Silicide/source-drain interface resistance is a major contributor to the total external parasitic resistance of semiconductor devices. As the source-drain contact dimensions are aggressively scaled, new approaches/methods are needed to reduce the interface resistance.

SUMMARY OF THE INVENTION

In one embodiment, a method for fabricating a semiconductor structure is provided. The method includes forming at least one structure on a substrate including at least one semiconductor fin, a disposable gate formed in contact with the semiconductor fin, and a spacer in contact with the disposable gate and the semiconductor fin. A source region and a drain region are epitaxially grown at least partially within the semiconductor fin. A contact metal layer is formed on and in contact with the source region and the drain region. One of a silicide and a germanide is formed on the source region and the drain region from the contact metal layer prior to removing the disposable gate, forming.

In another embodiment, a semiconductor structure is provided. The semiconductor structure includes at least a substrate and at least one semiconductor fin disposed on the substrate. A disposable gate contacts the at least one semiconductor fin. A spacer is disposed on the at least one semiconductor fin and in contact with the disposable gate. Epitaxially grown source and drain regions are disposed at least partially within the at least one semiconductor fin. A first one of silicide and germanide is disposed on and in contact with the source region. A second one of one of silicide and germanide is disposed on and in contact with the drain region.

In yet another embodiment, an integrated circuit is provided. The integrated circuit includes a semiconductor structure. The semiconductor structure includes at least a substrate and at least one semiconductor fin disposed on the substrate. A disposable gate contacts the at least one semiconductor fin. A spacer is disposed on the at least one semiconductor fin and in contact with the disposable gate. Epitaxially grown source and drain regions are disposed at least partially within the at least one semiconductor fin. A first one of silicide and germanide is disposed on and in contact with the source region. A second one of one of silicide and germanide is disposed on and in contact with the drain region.

In a further embodiment, a method for forming a semiconductor structure is provided. The method includes forming at least one structure comprising at least a substrate, a first source/drain layer, at least one semiconductor fin disposed on and in contact with the first source/drain layer, a gate structure in contact with the at least one semiconductor fin, and a second source/drain layer disposed on the gate structure. A dielectric layer is formed over the structure. A first contact trench is formed in the dielectric layer exposing a portion of the first source/drain layer. At least a second contact trench is formed in the dielectric layer exposing at least a portion of the second source/drain layer. A first contact metal layer is formed on and in contact with the exposed portion of the first source/drain layer. A second contact metal layer is formed on and in contact with the exposed portion of the second source/drain layer. One of a first silicide and a first germanide is formed in contact with the first source/drain layer from the first contact metal layer. One of a second silicide and a second germanide is formed in contact with the second source/drain layer from the second contact metal layer.

In another embodiment, a method for forming a semiconductor structure is provided. The method includes forming at least one structure comprising at least an alternating stack of semiconductor layers and metal gate material layers in contact with a substrate, a metal gate formed on and in contact with a top layer of the alternating stack, a spacer in contact with at least the metal gate, a source region, and a drain region in contact with the semiconductor layers of the alternating stack. A first contact metal layer is formed in contact with the source region. A second contact metal layer is formed in contact with the drain region. One of a first silicide and a first germanide is formed in contact with and surrounding the source region. One of a second silicide and a second germanide is formed in contact with and surrounding the drain region.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
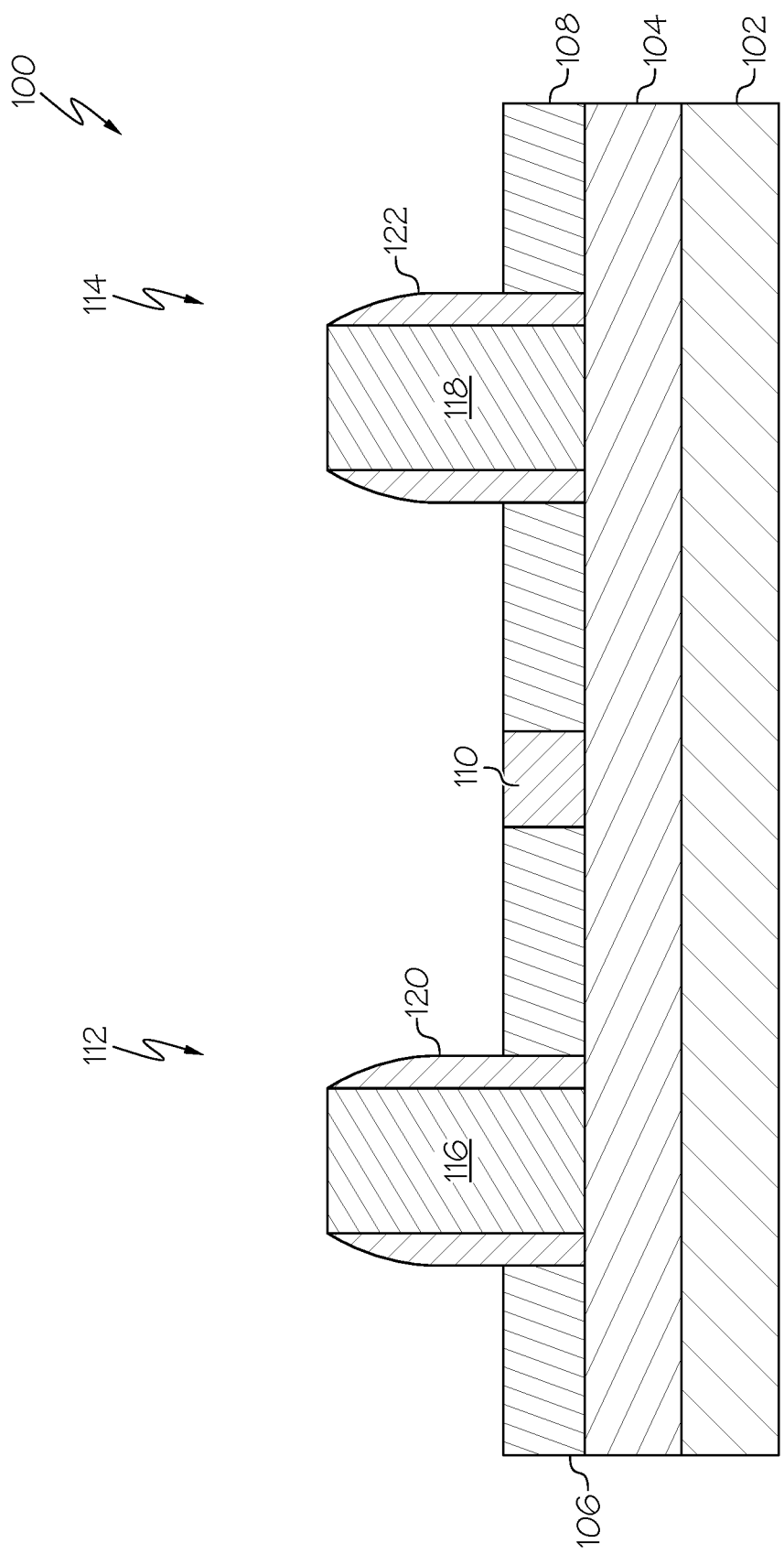
FIG. 1 is a cross-sectional view of an initial finFET semiconductor structure comprising disposable gates according to one embodiment of the present invention.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

One or more embodiments include a design for an integrated circuit chip, which is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer is able to transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein are utilized in the fabrication of integrated circuit chips. The resulting integrated circuit chips are distributable by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Referring now to the drawings in which like numerals represent the same of similar elements, FIGS. 1-25 illustrate various processes for fabricating semiconductor structures having low resistance source-drain contacts. FIG. 1 shows a cross-section of a semiconductor structure 100 at a starting point for embodiments of the present invention. For example, one or more embodiments of the present invention begin after semiconductor fins have been formed for NFET and PFET devices, and disposable gates have been formed thereon. It should be noted that embodiments of the present invention are not limited to the structures, layers, and materials discussed herein.

The semiconductor structure 100 of FIG. 1 comprises a substrate 102; a dielectric layer 104 (e.g., a BOX layer or oxide layer) overlying the substrate 102; one or more fin structures 106 in contact with the dielectric layer 104; device isolation regions 110 such as shallow trench isolation regions; and source/drain regions (not shown in this cross-section).

In one embodiment, the semiconductor structure 100 comprises substrate 102 such as a silicon-on-insulator (SOI) substrate; a dielectric layer 104 (e.g., a BOX layer or oxide layer) overlying the substrate 102; one or more fin structures 106, 108 overlying the dielectric layer 104, and one or more shallow trench isolation (STI) regions 110. The substrate layer 102 comprises at least one of Si, Ge alloys, SiGe, GaAs, InAs, InP, SiCGe, SiC, and other III/V or II/VI compound semiconductors. The dielectric layer 104, in one embodiment, is a crystalline or non-crystalline oxide, nitride, oxynitride, or any other insulating material. In one embodiment, at least one fin 106 is formed in an NFET region 112 of the structure 100 and at least one fin 108 is formed in a PFET region 114 of the structure. The fin(s) 106 within the NFET region 112 comprise, for example, a semiconductor material such as silicon (Si), while the fin(s) 108 within the PFET region 114 comprise a semiconductor material such as silicon germanium (SiGe).

P-type transistors are produced by doping the semiconductor layer from which the fin 106 is formed with elements from group III of the periodic table (e.g., boron, aluminum, gallium, or indium). As an example, the dopant can be boron in a concentration ranging from $1\times10E18$ atoms/cm3 to $2\times10E21$ atoms/cm3. N-type transistors are produced by doping the semiconductor layer from which the fin 108 is formed with elements from group V of the periodic table (e.g., phosphorus, antimony, or arsenic). The semiconductor layer can be undoped or doped with either p-type or n-type dopants through ion implantation, plasma doping, or gas phase doping.

FIG. 1 further shows that a disposable gate 116, 118 is formed over and in contact with each of the fins 106, 108. The disposable gates 116, 118 are formed, in one embodiment, using oxide, polysilicon, amorphous silicon, nitride, or a combination thereof. Depending on the material of the disposable gate 116, 118, spacers 120, 122 are formed on the sidewalls of the disposable gates 116, 118 by one or more spacer formation techniques. It should be noted that the disposable gates 116, 118 can also be real gates formed using the "gate first" integration scheme. An optional hard mask (not shown) can be formed on top of the dual disposable gates 116, 118. The hard mask can comprise a dielectric material such as a nitride, oxide, oxynitride material, and/or any other suitable dielectric layer.

Figure 2:
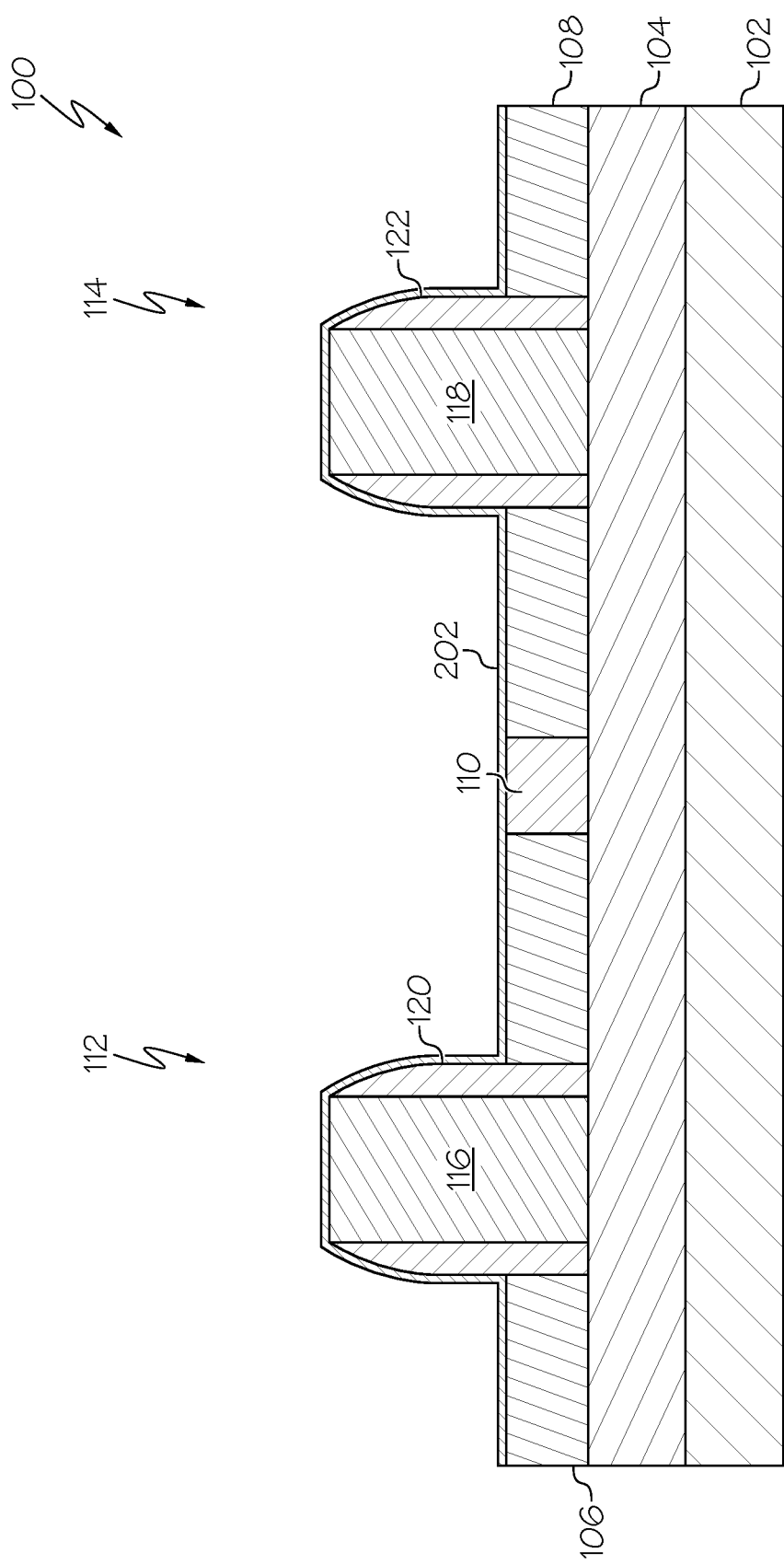
FIG. 2 is a cross-sectional view of the finFET semiconductor structure after a spacer has been formed over the structure according to one embodiment of the present invention.

After the structure 100 shown in FIG. 1 has been formed, a spacer 202 is formed over the entire structure 100, as shown in FIG. 2. In one embodiment, the spacer 202 is an iRAD spacer. In this embodiment, the spacer 202 is formed by forming a layer (e.g., silicon nitride (SiN)) via an iRAD process, which creates a very conformal layer and a dense film for the spacer layer from which the spacer 202 is formed. Techniques other than iRAD can be used to create the spacer 202, such as low-pressure chemical vapor deposition (LPCVD). In one embodiment, the spacer 202 is 4 nm to 12 nm thick.

Figure 3:
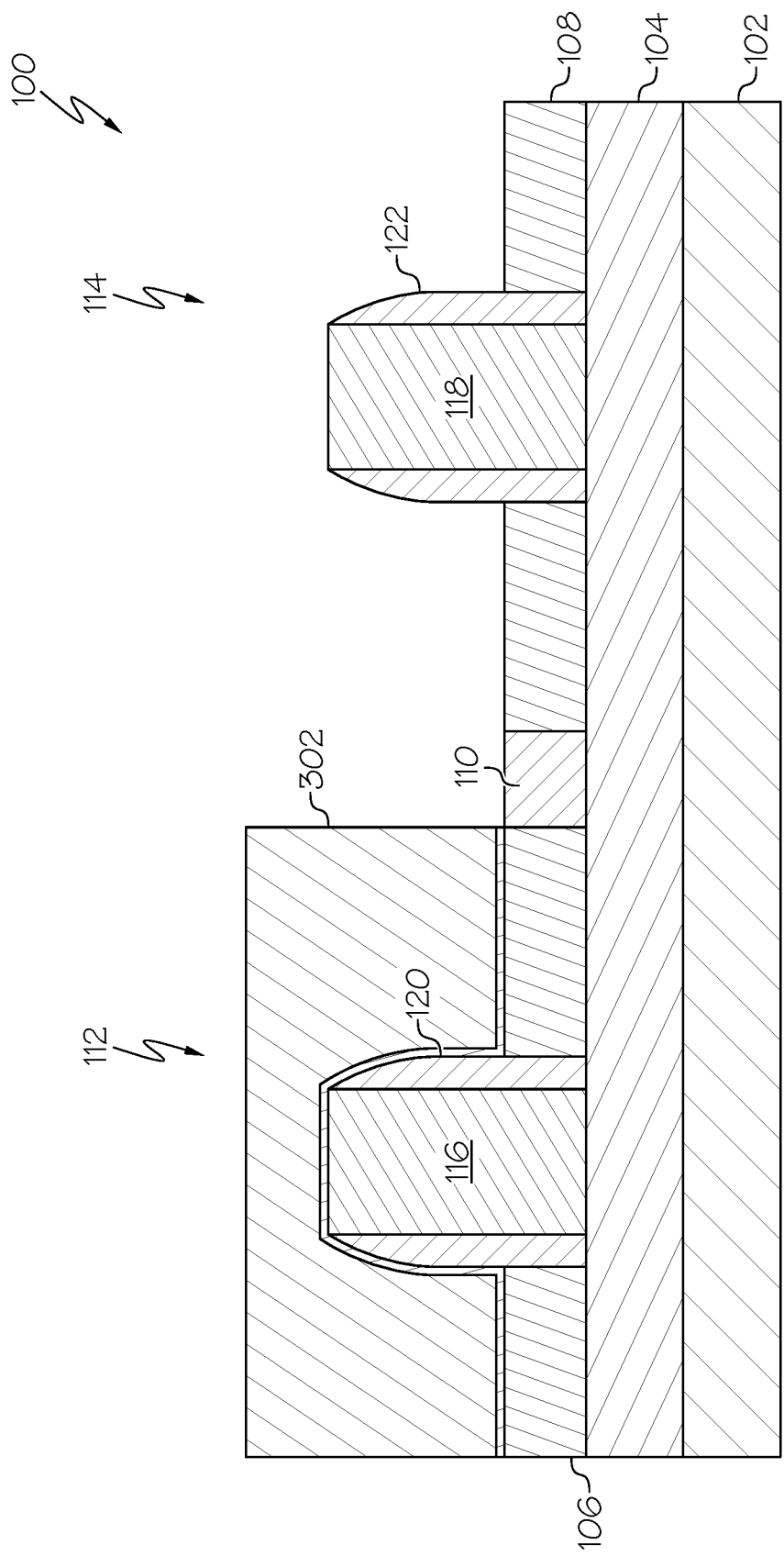
FIG. 3 is a cross-sectional view of the finFET semiconductor structure after the spacer has been removed from the PFET region and a masking layer has been formed over the NFET region according to one embodiment of the present invention.

FIG. 3 shows that the spacer layer 202 is selectively removed from the PFET region 114 of the structure 100 exposing the PFET fin(s) 108, disposable gate 118, and gate spacer 122. The NFET region 112 of the structure 100 is masked from the etch using a photoresist. For example, a conventional mask material 302 is formed on the NFET region 112 utilizing a conventional deposition process followed by lithography and etching such that only the NFET region 112 is covered by the mask 302 while the PFET region 114 is left exposed. The portion of the spacer layer 202 within the PFET region 114 is then removed. For example, a dry etching process such as RIE is performed to remove the spacer 202 from the PFET region 114 while the mask 302 prevents the portion of the spacer 202 within the NFET region 114 from being removed.

Figure 4:
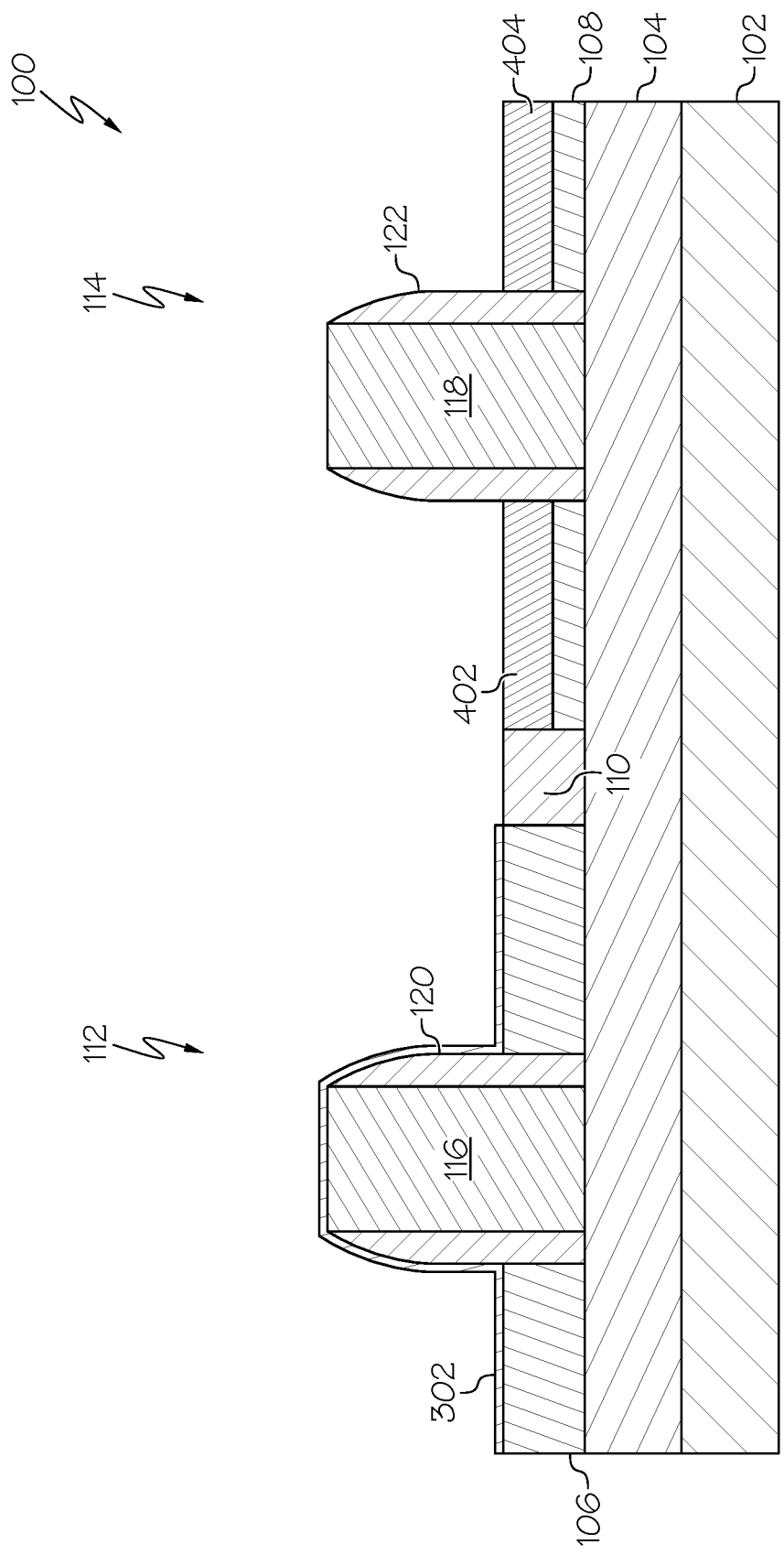
FIG. 4 is a cross-sectional view of the finFET semiconductor structure after source and drain regions have been epitaxially grown in the PFET region according to one embodiment of the present invention.

The mask layer 302 is removed utilizing one or more etching processes, and source/drain regions 402, 404 are formed within the PFET region 114, as shown in FIG. 4. In one embodiment, the source and drain regions 402, 404 are formed by an epitaxial growth process that epitaxially grows source/drain material on the fin 108. The terms "epitaxial growth", "epitaxial deposition", "epitaxially formed", "epitaxially grown", and their variants and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatus that are suitable for use in one or more embodiments include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). A number of different sources can be used for the deposition of the various layers discussed herein. For example, the gas source for the deposition of epitaxial semiconductor material can include a silicon containing gas source, a germanium containing gas source, a carbon containing gas source, or a combination thereof. Examples of silicon containing gas sources are silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane, and combinations thereof. Examples of germanium containing gas sources are germane, digermane, halogermane, dichlorogermane, trichlorogermane, tetrachlorogermane and combinations thereof. While an epitaxial silicon germanium alloy fin can be formed utilizing a combination of such gas sources. Carrier gases like hydrogen, nitrogen, helium and argon can be used.

In one embodiment, the epitaxially grown source/drain regions 402, 404 within the PFET region 114 comprise SiGe, SiGeC, or a bi-layer SiGe/SiGeC stack. The bi-layer stack, in one embodiment, is formed by introducing carbon-containing gases such as methane into the epitaxial growth chamber to grow carbon doped SiGe or SiGeC layer. In one embodiment, to concentration of carbon is less than 2 atomic percent; the concentration of Ge varies from 10% to 100%; the concentration of Si is 100%—the percentage of Ge. It should be noted that other percentages also apply. The source and drain regions 402, 404, in one embodiment, is formed with in-situ doping of the electrical dopants (e.g., boron, aluminum, gallium, or indium), or by deposition of an intrinsic semiconductor material and subsequent introduction of electrical dopants by ion implantation, plasma doping, gas phase doping, or out-diffusion from a disposable doped silicate glass layer.

Figure 5:
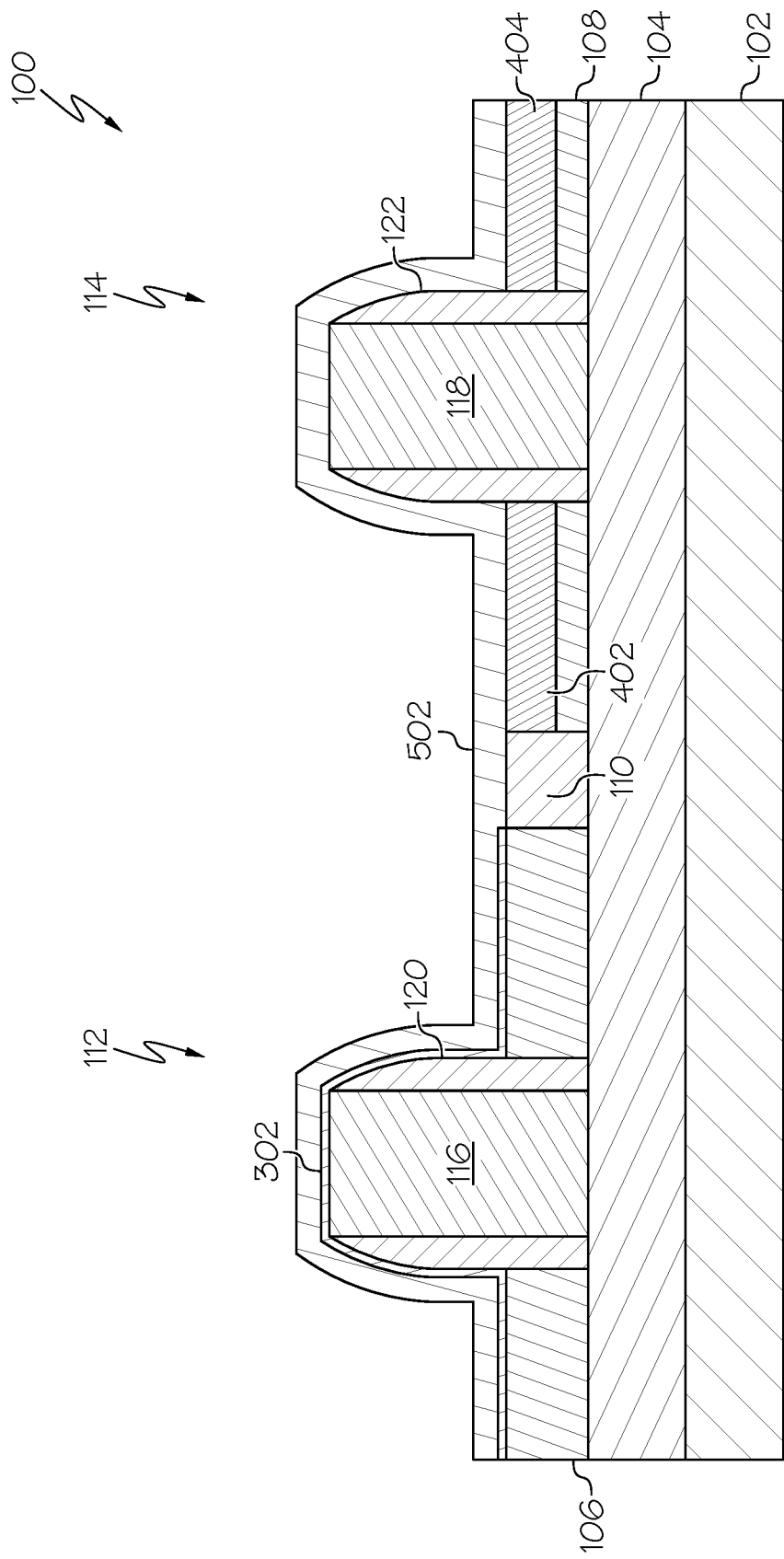
FIG. 5 is a cross-sectional view of the finFET semiconductor structure after a contact metal layer has been formed over the entire structure according to one embodiment of the present invention.

One or more contact metal/metallic layers 502 are then formed over the entire structure 100, as shown in FIG. 5. The contact metal layer 502 is formed over and in contact with the spacer layer 302 in the NFET region 112, the isolation region 110, the source/drain 402, 404 of the PFET device, and the disposable gate structure 118 (including the gate spacer 122) of the PFET device. The contact metal layer(s) 502, in one embodiment, is formed by chemical vapor deposition (CVD), physical vapor deposition (PVD), atomic layer deposition (ALD), or any combination thereof. The contact metal layer(s) 502, in one embodiment, comprises titanium (Ti), tantalum (Ta), hafnium (Hf), zirconium (Zr), niobium (Nb), or alloys comprising carbon. However, other materials are applicable as well. In one embodiment, the sheet resistivity of the material(s) used for the contact metal layer(s) 502 is less than 50 µOhm/cm. In another embodiment, the contact metal layer 502 comprises one or more high melting point (e.g., greater than 1500° C.) refractory metals such as molybdenum (Mo), ruthenium (Ru), vanadium (Va), tungsten (W), or the like. In one embodiment, the thickness of the metal layer 502 is 3 nm to 15 nm, although lesser or greater thicknesses apply.

As discussed above, the source/drain regions 402, 404, in one embodiment, comprise carbon in addition to SiGe. The carbon can be deposited in the top region of the epitaxy material during epitaxy growth. However, in another embodiment, an implantation process is performed to deposit carbon in the top region of source/drains 402, 404 after the contact metal layer 502 is formed, but prior a subsequent anneal process. The implantation process, in one embodiment, includes, a beam line implantation of carbon with beam energies tuned to implant carbon from the surface to 20 nm below the exposed surface. In yet another embodiment, an interlayer (not shown) comprising carbon can be formed on and in contact with a top surface of the source/drains 402, 404 prior to forming the contact metal layer 502. For example, a pure metal(s), metal carbide, alloy, etc. comprising carbon can be deposited by CVD, PVD, ALD, or any combination thereof to form the carbon-based interlayer. Alternatively, or in addition to, carbon is added through incorporation in the contact metal layer 502. For example, carbon can be added during formation of the contact metal layer utilizing, for example, an alloy target, change in CVD/ALD precursor, implantation into the contact metal layer 502, and/or the like.

Figure 6:
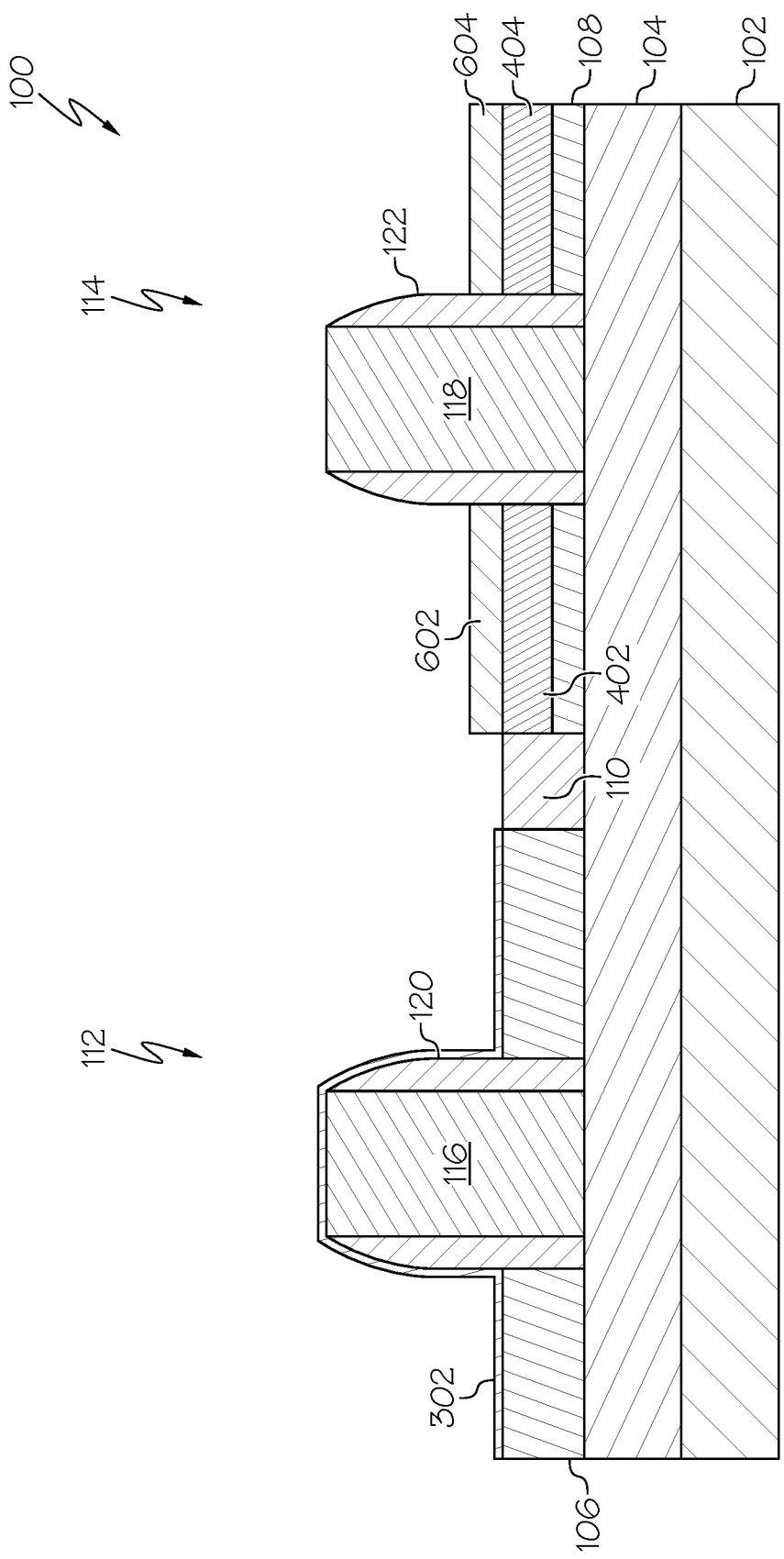
FIG. 6 is a cross-sectional view of the finFET semiconductor structure after silicide/germanide has been formed on the source and drain regions of the PFET region according to one embodiment of the present invention.

An anneal is then performed to form a silicide/germanide 602, 604, as shown in FIG. 6. The silicide/germanide 602, 604 is formed on and in contact with the source/drains 402, 404 resulting from the reaction of the contact metal layer(s) 502 with the source/drain material. In one embodiment, the thickness of the silicide is 5 nm to 40 nm depending on the phase of the silicide. The result of the anneal is silicides/germanides of Ti, Ta, Hf, Zr, or Nb. In one embodiment, the silicides/germanides 602, 604 comprise carbon for enhanced agglomeration resistance. In one embodiment, carbon is implanted into the silicide/germanide 602, 604. The anneal can be performed at temperature ranging from, for example, 700° C. to 1250° C. The spacer layer 302 prevents any silicide from being formed in the NFET region 112. Unreacted metal is then selectively removed from the structure 100.

Figure 7:
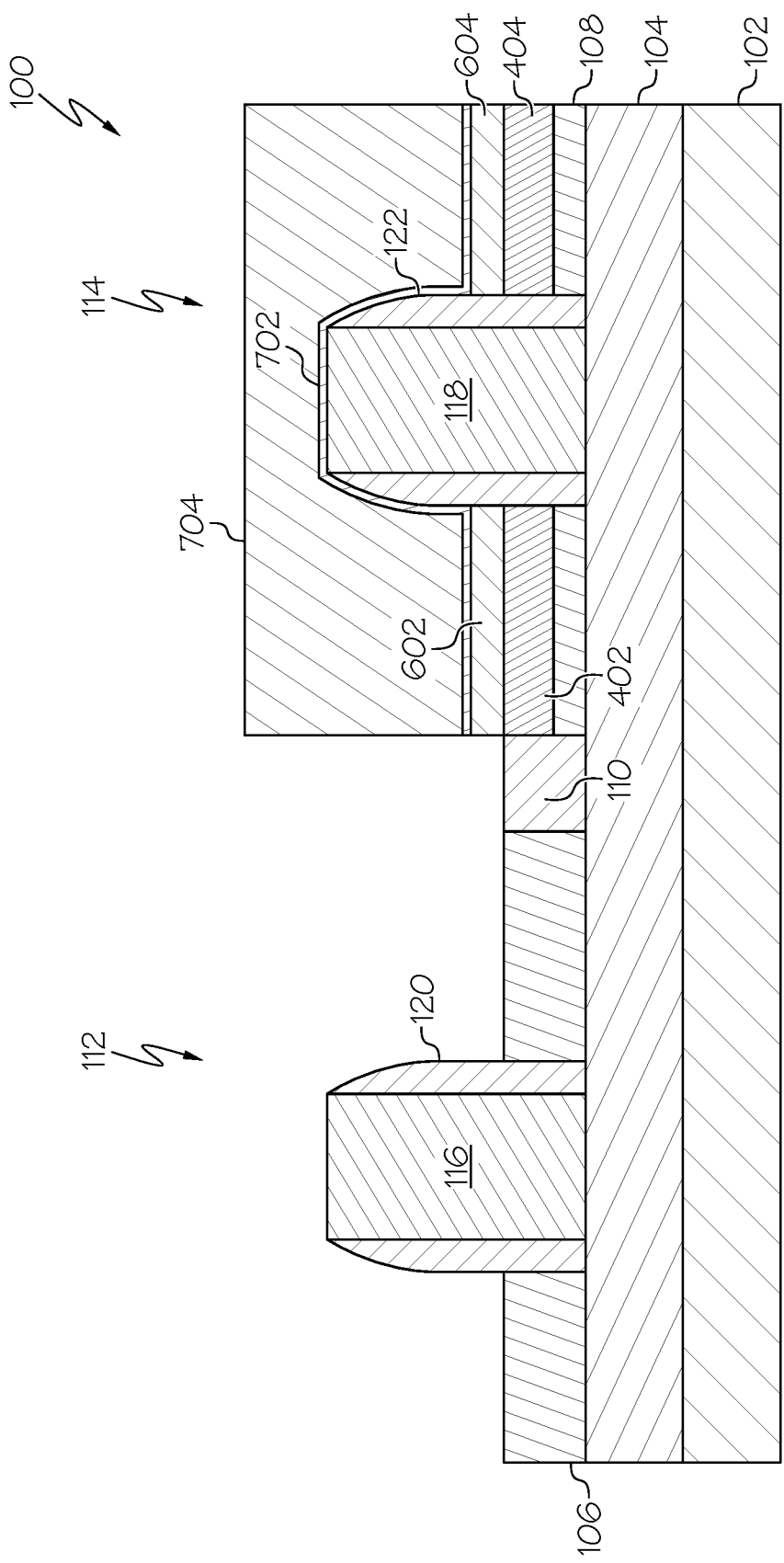
FIG. 7 is a cross-sectional view of the finFET semiconductor structure after a spacer and masking layer have been formed on the PFET region according to one embodiment of the present invention.

After the structure 100 shown in FIG. 6 has been formed, a spacer layer 702 is formed over the PFET region, as shown in FIG. 7. This spacer layer 702 is similar to the spacer layer 202 discussed above with respect to FIGS. 2 and 3. The spacer layer 702 is formed over the entire structure 100 and selectively removed from the NFET region 112. This exposes the NFET fin(s) 106, disposable gate 116, and gate spacer 120. The PFET region 114 of the structure 100 is masked from the etch using a photoresist. For example, a conventional mask material 704 is formed on the PFET region 114 utilizing a conventional deposition process followed by lithography and etching such that only the PFET region 114 is covered by the mask 302 while the NFET region 112 is left exposed. The portion of the spacer layer 704 within the NFET region 112 is then removed.

Figure 8:
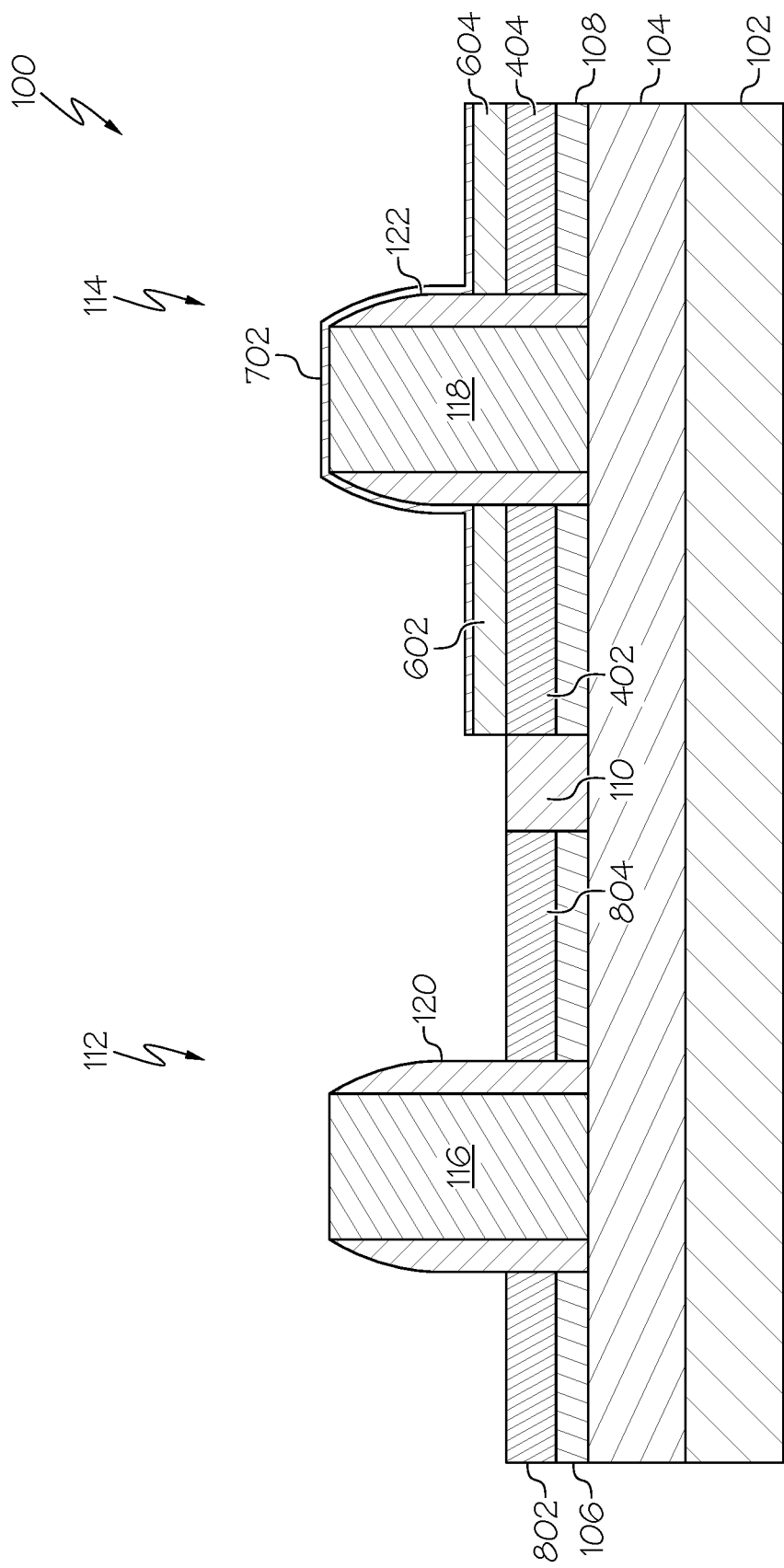
FIG. 8 is a cross-sectional view of the finFET semiconductor structure after source and drain regions have been epitaxially grown in the NFET region according to one embodiment of the present invention.

The mask layer 704 is removed utilizing one or more etching processes, and source/drain regions 802, 804 are formed within the NFET region 112, as shown in FIG. 8. In one embodiment, the source and drain regions 802, 804 are formed by an epitaxial growth process similar to that discussed above with respect to the PFET region 114. In one embodiment, the epitaxially grown source/drain regions 802, 804 within the NFET region 114 comprise Si:P SiC:P, SiAs, SiC:As and/or the like. The source and drain regions 802, 804, in one embodiment, is formed with in-situ doping of the electrical dopants (e.g., phosphorus, antimony, or arsenic), or by deposition of an intrinsic semiconductor material and subsequent introduction of electrical dopants by ion implantation, plasma doping, gas phase doping, or out-diffusion from a disposable doped silicate glass layer. In one embodiment, the doping concentration is in the range of $1E19/cm^3$ to $3E21/cm^3$.

Figure 9:
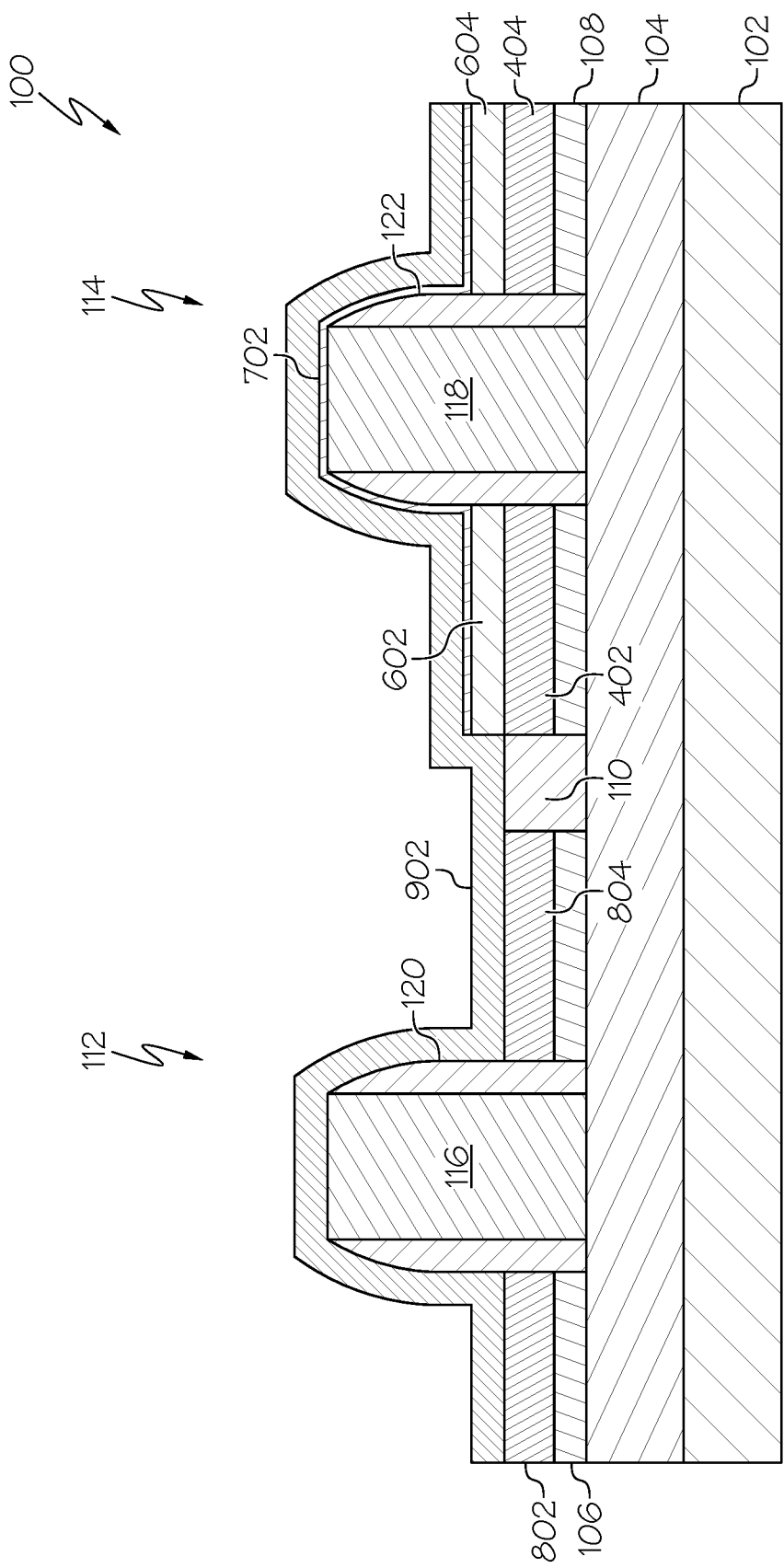
FIG. 9 is a cross-sectional view of the finFET semiconductor structure after a contact metal layer has been formed over the entire structure according to one embodiment of the present invention.

One or more contact metal/metallic layers 902 are then formed over the entire structure 100, as shown in FIG. 9. The contact metal layer 902 is formed over and in contact with the the source/drain 802, 804 of the NFET device, the disposable gate structure 116 (including the gate spacer 120) of the NFET device, the isolation region 110, and the spacer layer 702 in the PFET region 114. The contact metal layer(s) 902, in one embodiment, is formed by chemical vapor deposition (CVD), physical vapor deposition (PVD), atomic layer deposition (ALD), or any combination thereof. The contact metal layer(s) 902, in one embodiment, comprises titanium (Ti), tantalum (Ta), TiN, hafnium (Hf), zirconium (Zr), niobium (Nb), or alloys comprising carbon. However, other materials are applicable as well. In one embodiment, the sheet resistivity of the material(s) used for the contact metal layer(s) 902 is less than 50 μOhm/cm. In another embodiment, the contact metal layer 902 comprises one or more high melting point (e.g., greater than 1500° C.) refractory metals such as molybdenum (Mo), ruthenium (Ru), vanadium (Va), tungsten (W), or the like. In one embodiment, the thickness of the metal layer 902 is 3 nm to 15 nm, although lesser or greater thicknesses apply.

As discussed above, the source/drain regions 802, 804, in one embodiment, comprise carbon in addition to Si:P or Si:As. The carbon can be deposited in the top region of the epitaxy material during epitaxy growth. However, in another embodiment, an implantation process is performed to deposit carbon in the top region of source/drains 802, 804 after the contact metal layer 902 is formed, but prior a subsequent anneal process, as discussed above. In yet another embodiment, an interlayer (not shown) comprising carbon can be formed on and in contact with a top surface of the source/drains 802, 804 prior to forming the contact metal layer 902. For example, a pure metal(s), metal carbide, alloy, etc. comprising carbon can be deposited by CVD, PVD, ALD, or any combination thereof to form the carbon-based interlayer. Alternatively, or in addition to, carbon is added through incorporation in the contact metal layer 902. For example, carbon can be added during formation of the contact metal layer utilizing, for example, an alloy target, change in CVD/ALD precursor, implantation into the contact metal layer 902, and/or the like.

Figure 10:
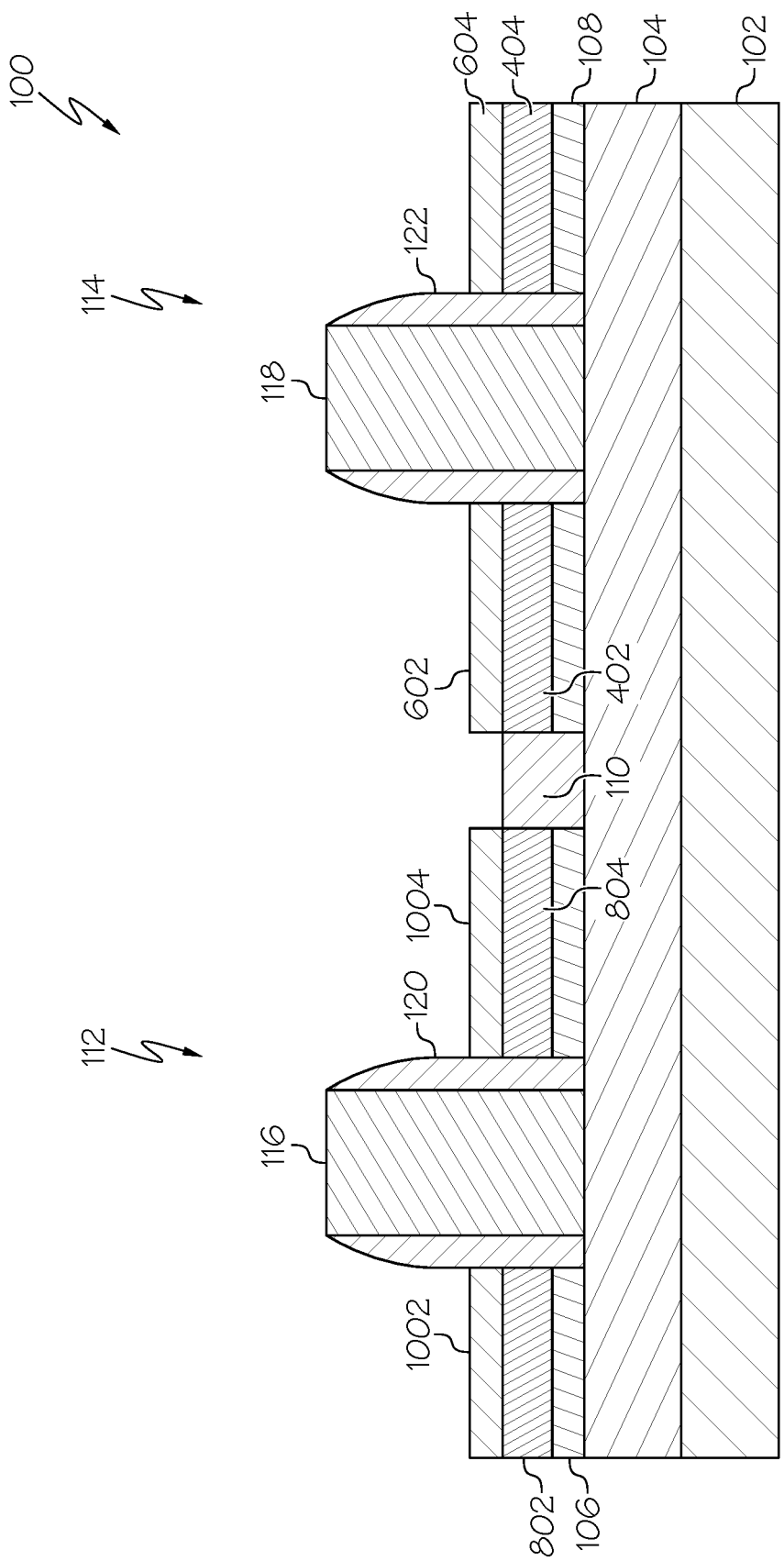
FIG. 10 is a cross-sectional view of the finFET semiconductor structure after silicide/germanide has been formed on the source and drain regions of the NFET region according to one embodiment of the present invention.

An anneal is then performed to form a silicide 1002, 1004, as shown in FIG. 10. The silicide 1002, 1004 is formed on and in contact with the source/drains 802, 804 resulting from the reaction of the contact metal layer(s) 902 with the source/drain material. In one embodiment, the thickness of the silicide is 5 nm to 40 nm depending on the phase of the silicide. The result of the anneal is silicides of Ti, Ta, Hf, Zr, or Nb. In one embodiment, the silicide 1002, 1004 comprise carbon for enhanced agglomeration resistance. In one embodiment, carbon is implanted into the silicide 1002, 1004. The anneal can be performed at temperature ranging from, for example, 700° C. to 1250° C. Unreacted metal is then selectively removed from the structure 100.

Figure 11:
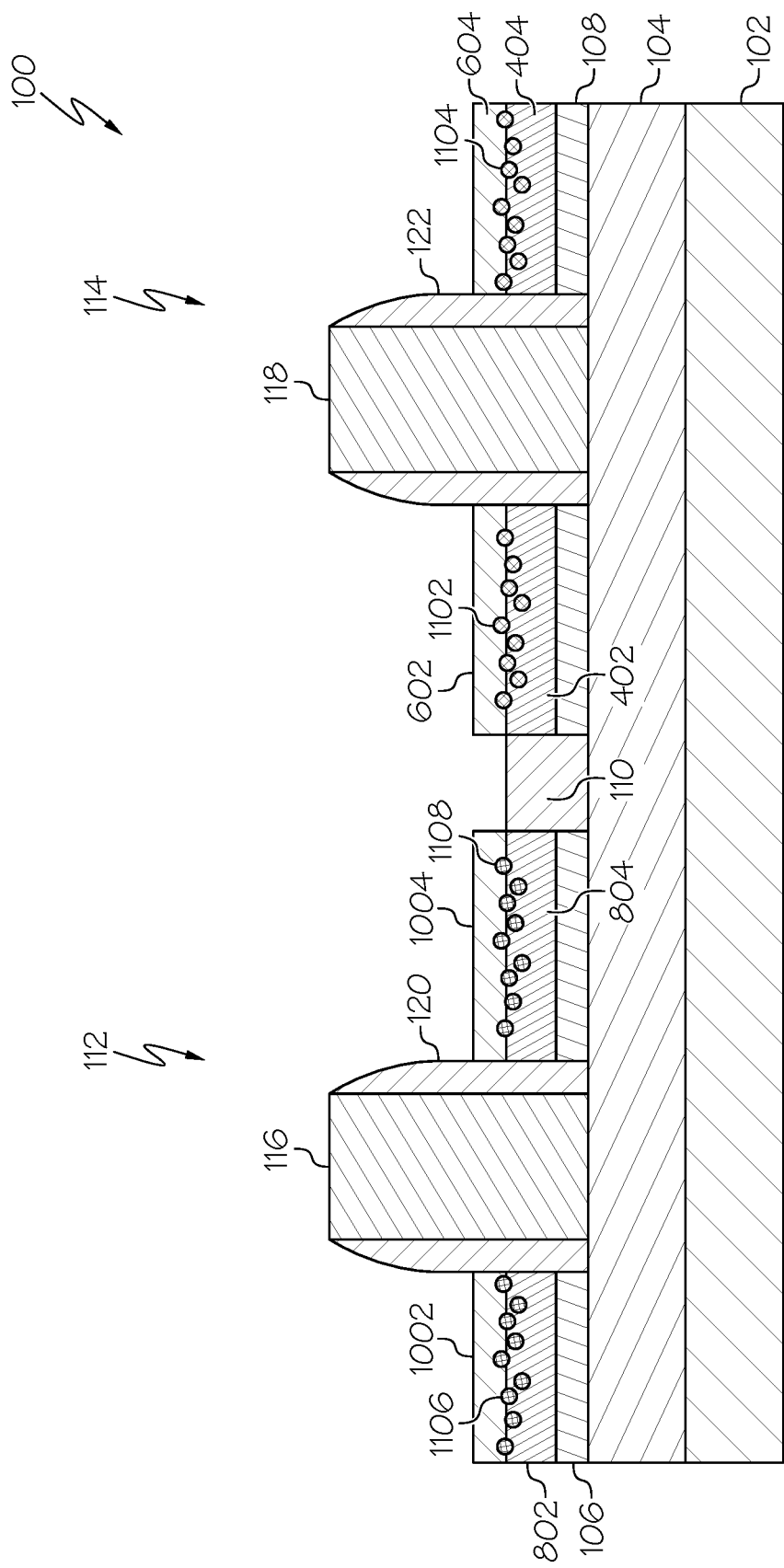
FIG. 11 is a cross-sectional view of the finFET semiconductor structure after an implantation process has been performed to segregate and activate dopants at the source/drain-silicide/germanide interfaces according to one embodiment of the present invention.

After the silicide (or germanide) 602, 604, 1002, 1004 has been formed in both the NFET and PFET regions 112, 114, an optional implantation process can be performed through the silicide (or germanide) 602, 604, 1002, 1004 in both regions. For example, the NFET region is blocked by forming a mask layer thereon using lithography and patterning techniques. An implantation process is then performed to implant elements from group III of the periodic table (e.g., boron, aluminum, gallium, or indium) into the PFET silicide 602, 604. The implantation process can include beam line or plasma implantation, and the doping concentrations are in the range of 1E20/cm3 to 5E22/cm3. An anneal is then performed to segregate and activate the dopants at the source/drain and silicide interfaces 1102, 1104, as shown in FIG. 11. The anneal can be performed at temperature ranging from, for example, 700° C. to 1250° C. The NFET region 112 is protected from this implantation process by the mask.

Once the implantation process has been performed in the PFET region 114, the mask is removed from the NFET region 112 via an ashing process. A mask is then formed over the PFET region 114 (similar to the NFET region 112) and an implantation process is performed to implant elements from group V of the periodic table (e.g., phosphorus, antimony, or arsenic) into the NFET silicide 1002, 1004. In one embodiment, the doping concentration is in the range of $1E19/cm^3$ to $3E21/cm^3$. The PFET region 114 is protected from this implantation process by the mask. Once the implantation process has been performed in the NFET region 112, an anneal is then performed to segregate and activate the dopants at the source/drain and silicide interfaces 1106, 1108, as shown in FIG. 11. The anneal can be performed at temperature ranging from, for example, 700° C. to 1250° C., although lesser and greater temperatures are applicable as well. The mask is removed from the PFET region 114 via an ashing process. In one embodiment, a single anneal can be performed for both the NFET region 112 and the PFET region 114. Conventional fabrication techniques can then be performed to complete the fabrication of the NFET and PFET devices. Using the above process, source-drain contacts can be fabricated with extremely low contact resistivity that are resistant to degradation via agglomeration due to downstream processing. Thus, highly reliable and low resistivity source-drain contacts can be formed.

Figure 12:
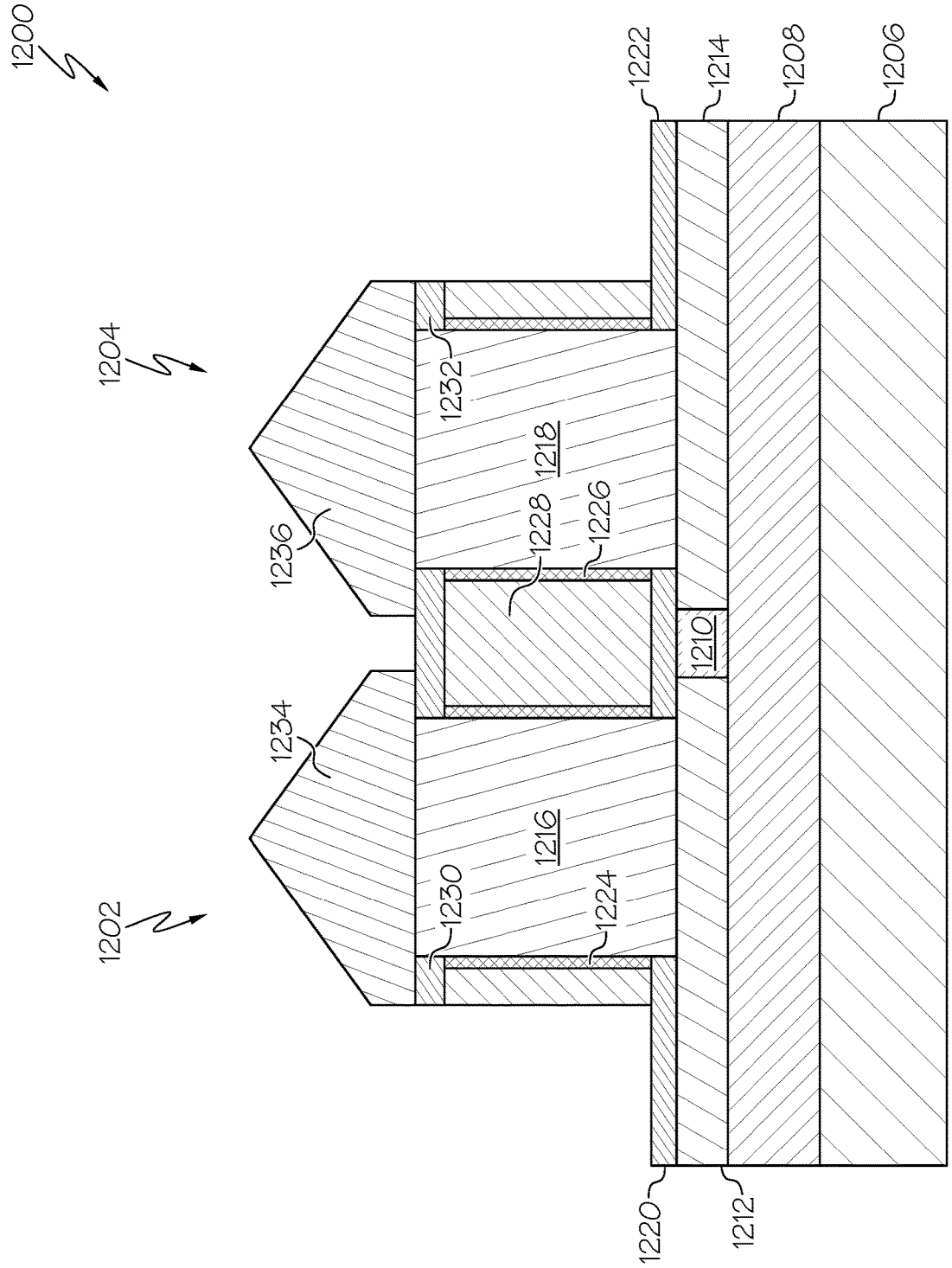
FIG. 12 is a cross-sectional view of an initial vertical FET semiconductor structure after each top source/drain has been formed in the NFET and PFET regions according to one embodiment of the present invention.

The above embodiments are not limited to finFET devices and are applicable to other devices such as vertical finFETs and nanosheet FETs. For example, FIG. 12 shows a vertical finFET structure 1200 at a starting point for embodiments of the present invention. One or more embodiments of the present invention begin after the top source/drain regions have been formed for the NFET and PFET devices. It should be noted that embodiments of the present invention are not limited to the particular vertical finFET structure shown in FIG. 12. Embodiments of the present invention are applicable to any vertical finFET structure and methods for fabricating the same.

In the example shown in FIG. 12, the structure 1200 comprises an NFET region 1202 and a PFET region 1204. Both of these regions are formed on a substrate 1206 and an insulator layer 1208. The NFET and PFET regions 1202, 1204 are isolated by an isolation layer 1210. The thickness of the substrate 102 can be, for example, from 50 microns to 1,000 microns, although lesser and greater thicknesses can be employed as well. The substrate 1206 can be single crystalline and or a bulk substrate, a semiconductor-on-insulator (SOI) substrate, or a hybrid substrate. The insulator layer 1208 comprises a dielectric material such as silicon oxide, silicon nitride, silicon oxynitride, or any combination thereof. In one embodiment, the insulator layer 1208 is a buried oxide (BOX) layer. An optional counter-doped layer (not shown) can be formed on and in contact with the substrate 1206 (or buried insulator layer if formed). The counter-doped layer, in one embodiment, is formed by an epitaxial growth of a semiconductor material.

Each region 1202, 1204 comprises a first doped layer 1212, 1214 (also referred to herein as the "bottom source/drain layer" 1212, 1214), and a channel layer 108. The substrate 102 can be single crystalline and or a bulk substrate, a semiconductor-on-insulator (SOI) substrate, or a hybrid substrate. The insulator layer 104 comprises a dielectric material such as silicon oxide, silicon nitride, silicon oxynitride, or any combination thereof. In one embodiment, the insulator layer 104 is a buried oxide (BOX) layer. The bottom source/drain layers 1212, 1214 are formed on and in contact with the insulator layer 1208 (or counter-doped layer if formed). In the NFET region 1202, the bottom source/drain layer 1212 is an n++ doped region of the substrate 1206. In the PFET region 1204, the bottom source/drain layer 1214 is a p++ doped region of the substrate 1206. In one embodiment, the bottom source/drain layers 1212, 1214 have a thickness in a range of, for example, about 10 nm to about 200 nm. However, other thicknesses are applicable as well. The bottom source/drain layers 1212, 1214 can be formed by epitaxial growth.

Each of the NFET and PFET regions 1202, 1204 comprise one or more fin structures 1216, 1218. The fins 1216, 1218 are formed, for example, from a channel material that was epitaxially grown up from the bottom source/drain layers 1212, 1214. In the NFET region 1202, the fin(s) 1216 include a material that is undoped or doped n-type dopants through ion implantation, plasma doping, or gas phase doping. N-type transistors are produced by doping the channel material with elements from group V of the periodic table (e.g., phosphorus, antimony, or arsenic). As an example, the dopant can be phosphorus in a concentration ranging from $1 \times 10E14$ atoms/cm3 to $1 \times 10E20$ atoms/cm3. In the PFET region 1204, the fin(s) 1218 include a material that is is undoped or doped n-type dopants through ion implantation, plasma doping, or gas phase doping. P-type transistors are produced by doping the channel material with elements from group III of the periodic table (e.g., boron, aluminum, gallium, or indium). As an example, the dopant can be boron in a concentration ranging from $1 \times 10E18$ atoms/cm3 to $2 \times 10E21$ atoms/cm3.

FIG. 12 further shows that bottom spacers 1220, 1222 are formed within each of the NFET and PFET regions 1202, 1204. The bottom spacers 1220, 1222 are formed in contact with each of the fins 1216, 1218. Each bottom spacer 1220, 1222 contacts a top surface of their respective source/drain layer 1212, 1214 and sidewalls of their respective fin(s) 1216, 1218. In one embodiment, the bottom spacers 1220, 1222 comprise an insulating material (such as silicon oxide, silicon nitride, silicon oxynitride, or a combination of these) and can be formed using any conventional deposition and etching processes such as, for example, chemical vapor deposition (CVD) and subsequent etching techniques. In one embodiment, the spacers 1220, 1222 have a thickness of, for example, 3 nm to 30 nm.

High-k dielectric layers 1224, 1226 are formed on and in contact with the sidewalls of each fin 1216, 1218 and the top surface of the bottom spacers 1220, 1222. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k layers 1224, 1226 may further include dopants such as lanthanum or aluminum.

In one embodiment, the high-k layers 1224, 1226 are part of a layer comprising a work function metal layer (not shown). In one embodiment, the work function metal layers are formed after and conformal to the high-k layers 1224, 1226 employing CVD, sputtering, or plating. The work function metal layers comprise one or more metals having a function suitable to tune the work function of NFETs or PFETs. Exemplary first metals that can be employed in the work function metal layer include, but are not limited to La, Ti and Ta. The thickness of the work function metal layers can be from 3 nm to 15 nm, although lesser and greater thicknesses can also be employed.

FIG. 12 further shows that a metal gate 1228 is formed around the fins 1216, 1218. For example, a metal gate material can be deposited by atomic layer deposition (ALD) or physical vapor deposition (PVD). In one embodiment, the metal gate 1228 is a continuous metal gate that wraps around both fins 1216, 1218. The metal gate 1228 contacts the outer sidewalls of the high-k gate dielectric layers 1224, 1226; the top surface of a portion of the bottom spacers 1220, 1222; and a top surface of the dielectric 1210 formed between the fins 1216, 1218. A top surface of the metal gate 1228 is co-planar with the top surface of the high-k dielectric layers 1224, 1226. In one embodiment, the metal gate 1228 comprises, for example, tungsten.

Each of the NFET and PFET regions 1202, 1204 also include top spacers 1230, 1232. The top spacers 1230, 1232 comprise a bottom surface that contacts the top surface of the metal gate 1228; the top surface of the high-k dielectric layers 1224, 1226; and portions of the sidewalls of the fins 1216, 1218 that are above the metal gate 1228 and the high-k dielectric layers 1216, 1218. The top surface of the top spacers 1230, 1232 is co-planar with the top surfaces of the fins 1216, 1218. In one embodiment, the top spacers 1230, 1232 comprise the same or different material as the bottom spacers 1220, 1222. For example, the top spacers 1230, 1232 can comprise an insulating material (such as silicon oxide, silicon nitride, silicon oxynitride, or a combination of these) and can be formed using any conventional deposition process such as, for example, chemical vapor deposition (CVD) and subsequent etching techniques. The deposited spacer material is then subsequently etched to form the final spacer structures.

FIG. 12 further shows a doped layer 1234, 1236 (also referred to herein as the "top source/drain layer") formed on and in contact with each the fins 1216, 1218 and their respective top spacer 1230, 1232. A bottom surface of the top source/drain layers 1234, 1236 contacts a top surface of the fins 1216, 1218 and a top surface of the top spacers 1230, 1232. The top source/drain layers 1234, 1236 have a thickness in a range of, for example, about 10 nm to about 200 nm. However, other thicknesses are applicable as well. The top source/drain layers 1234, 1236 can be formed by epitaxial growth.

In one embodiment, the top source/drain layers 1234, 1236 have a "diamond-shaped/cross-section". It should be noted that, in other embodiments, the top source/drain layers 1234, 1236 do not include a diamond-shaped/cross-section and has a planar configuration. In these embodiments, the top source/drain 1204 is formed on and in contact with each the fins 106, 108, 110 and the top spacer layer 1108. A bottom surface of the top source/drain layer 1204 contacts the top surface of the fins 106, 108, 110 and the top surface of the top spacer 1108. The top source/drain layer 1204 has a thickness in a range of, for example, about 10 nm to about 200 nm. However, other thicknesses are applicable as well. In any of the embodiment, the top source/drain layer 1204 can be formed by epitaxial growth.

Figure 13:
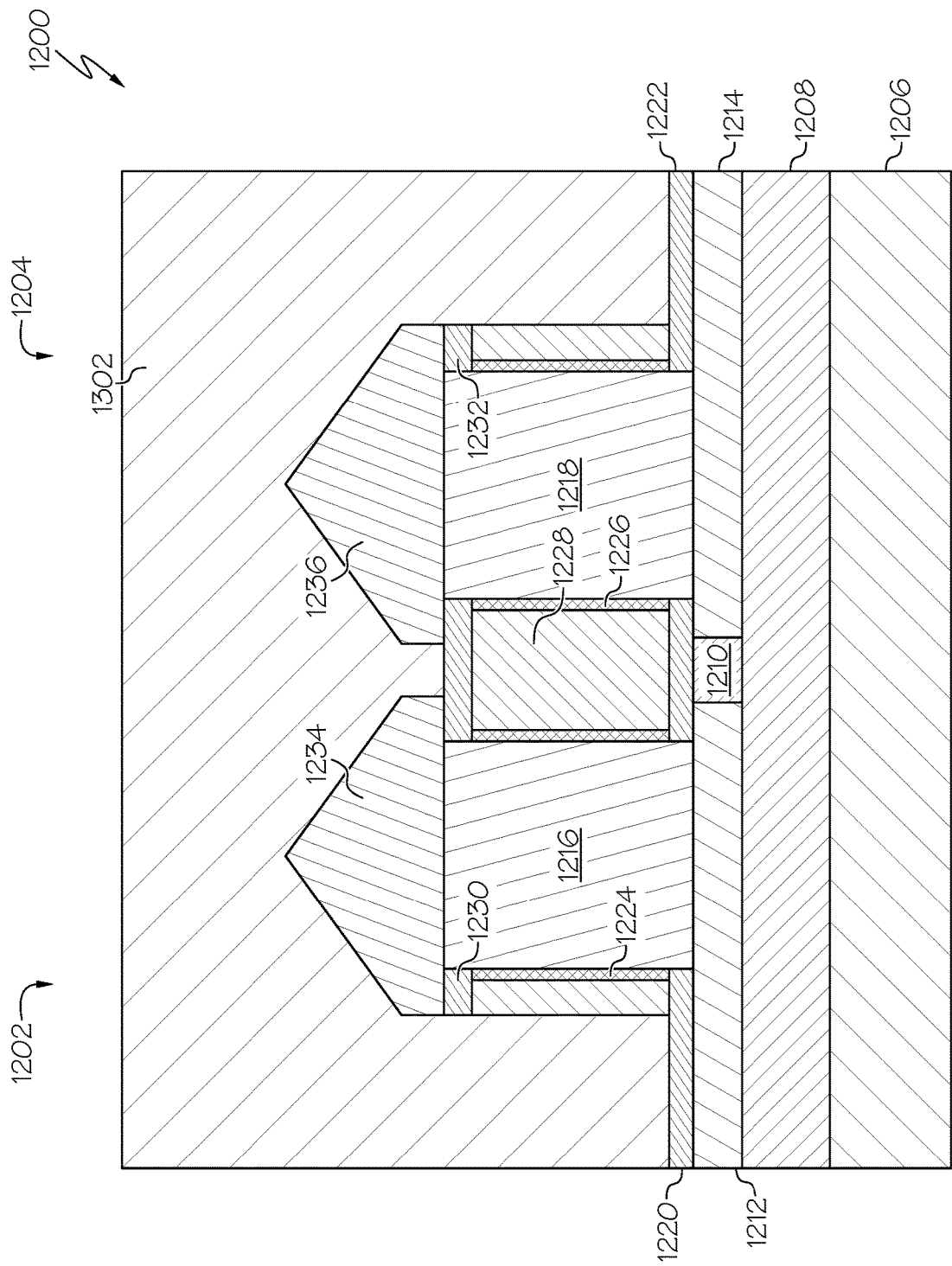
FIG. 13 is a cross-sectional view of the vertical FET semiconductor structure after a dielectric layer has been formed over the structure according to one embodiment of the present invention.

After the structure 1200 shown in FIG. 12 has been formed, a dielectric layer 1302 is formed over the entire structure 1200, as shown in FIG. 13. It should be noted that a portion of this dielectric can be formed during the fabrication of the structure 1200 shown in FIG. 12. In this embodiment, an additional dielectric layer can be formed on top of the previous layer to form the dielectric layer shown in FIG. 13. The dielectric layer 1302, in one embodiment, includes $SiO_2$, $Si_3N_4$, $SiO_xN_y$, SiC, SiCO, SiCOH, and SiCH compounds; one or more silicon-based materials with some or all of the Si replaced by Ge; carbon-doped oxides; inorganic oxides; inorganic polymers; hybrid polymers; organic polymers such as polyamides or SiLK™; other carbon-base materials; organo-inorganic materials such as spin-on glasses and silsesquioxane-based materials; and diamond-like carbon (DLC, also known as amorphous hydrogenated carbon, $\alpha$-C:H). Additional choices for the blanket dielectric include any of the aforementioned materials in porous form, or in a form that changes during processing to or from being porous and/or permeable to being non-porous and/or non-permeable.

Figure 14:
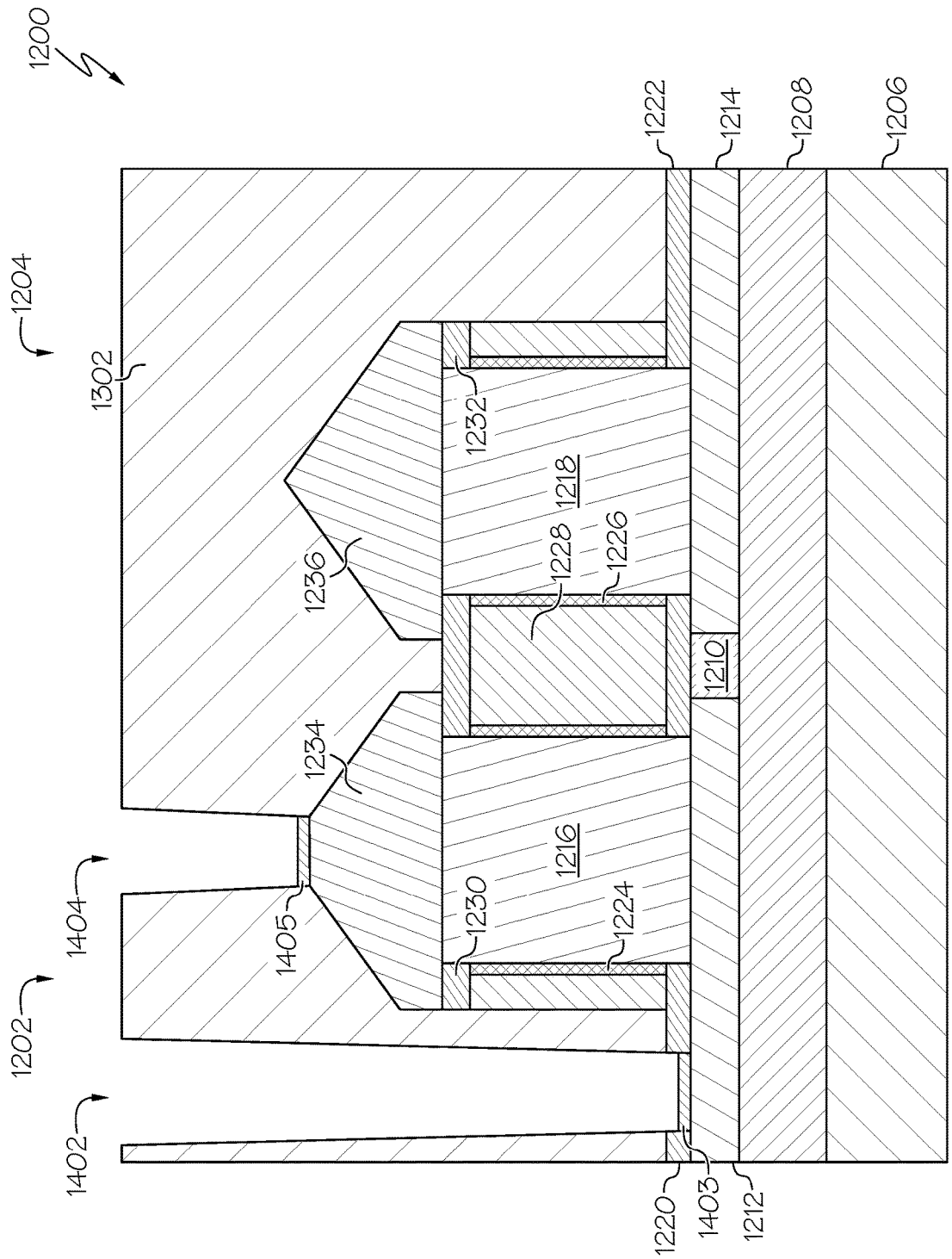
FIG. 14 is a cross-sectional view of the vertical FET semiconductor structure after contact trenches have been formed to expose a portion of the top source/drain and bottom source/drain in the NFET region according to one embodiment of the present invention.

The dielectric layer 1302 is then patterned and etched to form a first contact opening/trench 1402 down to and exposing at least a portion of the bottom source/drain 1212 in the NFET region 1202 (or PFET region 1204), as shown in FIG. 14. The dielectric layer is also patterned and etched to form a second contact opening 1404 down to and exposing a portion of the top source/drain 1234 in the NFET region 1202. In this embodiment, a mask (not shown) is formed over the PFET region 1204 to prevent any etching of the dielectric 1302 in the PFET region 1204.

One or more contact metal/metallic layers 1403, 1405 are then formed over the entire structure, similar to the contact metal layer(s) 902 of FIG. 9, and an etch is performed to remove contact metal layer from all surfaces except the exposed portions of the bottom source/drain 1212 within the first contact opening 1402 and the exposed portions of the top source/drain 1234 within the second contact opening 1404. The contact metal layer(s) 1403, 1405, in one embodiment, is formed by chemical vapor deposition (CVD), physical vapor deposition (PVD), atomic layer deposition (ALD), or any combination thereof. The contact metal layer(s) 1403, 1405, in one embodiment, comprises titanium (Ti), tantalum (Ta), TiN, hafnium (Hf), zirconium (Zr), niobium (Nb), or alloys comprising carbon. However, other materials are applicable as well. In one embodiment, the sheet resistivity of the material(s) used for the contact metal layer(s) 1403, 1405 is less than 50 μOhm/cm. In another embodiment, the contact metal layer 1403 comprises one or more high melting point (e.g., greater than 1500° C.) refractory metals such as molybdenum (Mo), ruthenium (Ru), vanadium (Va), tungsten (W), or the like. In one embodiment, the thickness of the metal layer 1403, 1405 is 3 nm to 15 nm, although lesser or greater thicknesses apply.

Figure 29:
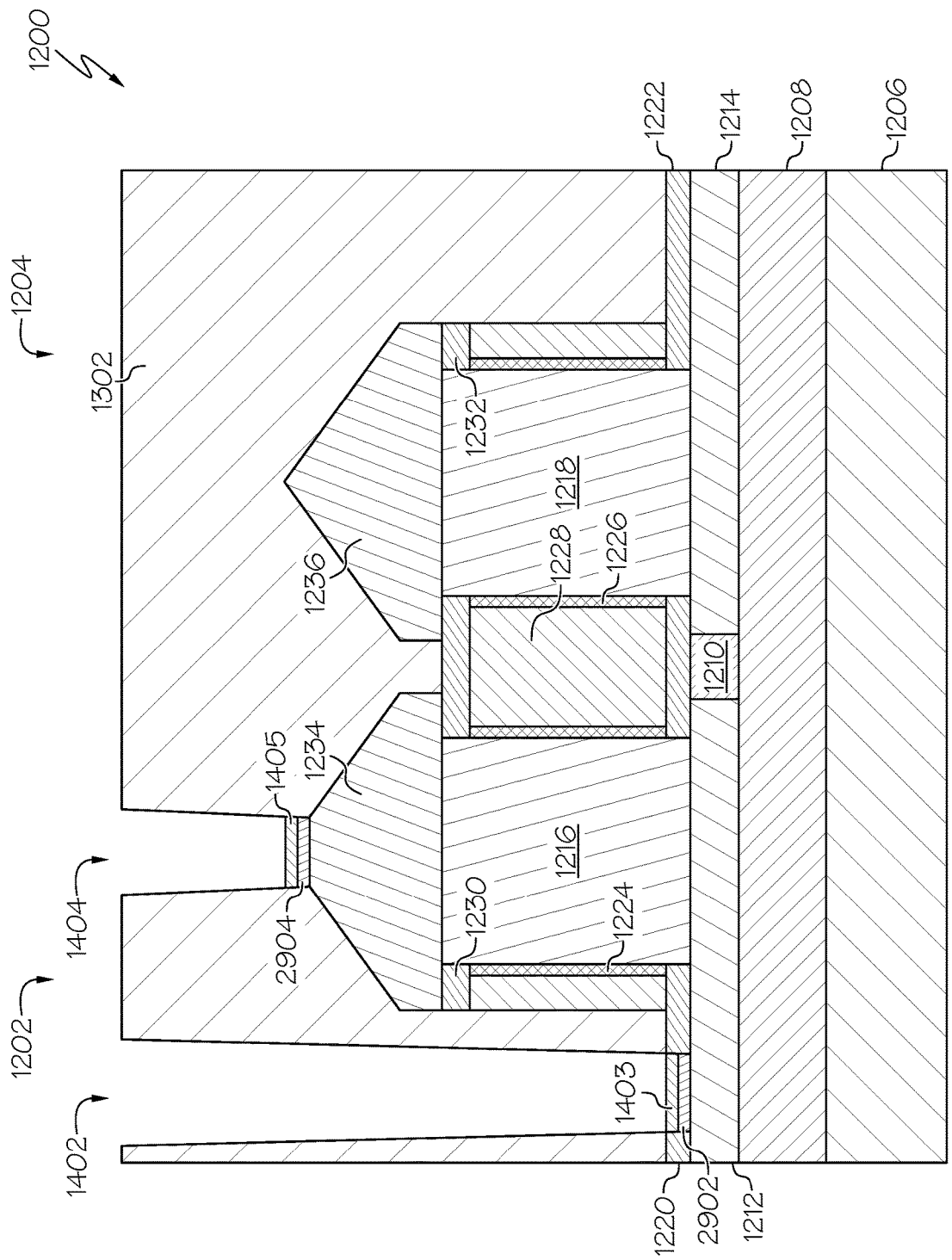

In one embodiment, an interlayer 2902, 2904 (FIG. 29) comprising carbon can be formed on and in contact with the exposed portions of the bottom source/drain 1212 and the exposed portions of the top source/drain 1234 prior to forming the contact metal layer 1403, 1405. For example, a pure metal(s), metal carbide, alloy, etc. comprising carbon can be deposited by CVD, PVD, ALD, or any combination thereof to form the carbon-based interlayer 2902, 2904. Alternatively, or in addition to, carbon is added through incorporation in the contact metal layer 1403, 1405. For example, carbon can be added during formation of the contact metal layer utilizing, for example, an alloy target, change in CVD/ALD precursor, implantation into the contact metal layer 1403, 1405, and/or the like.

Figure 15:
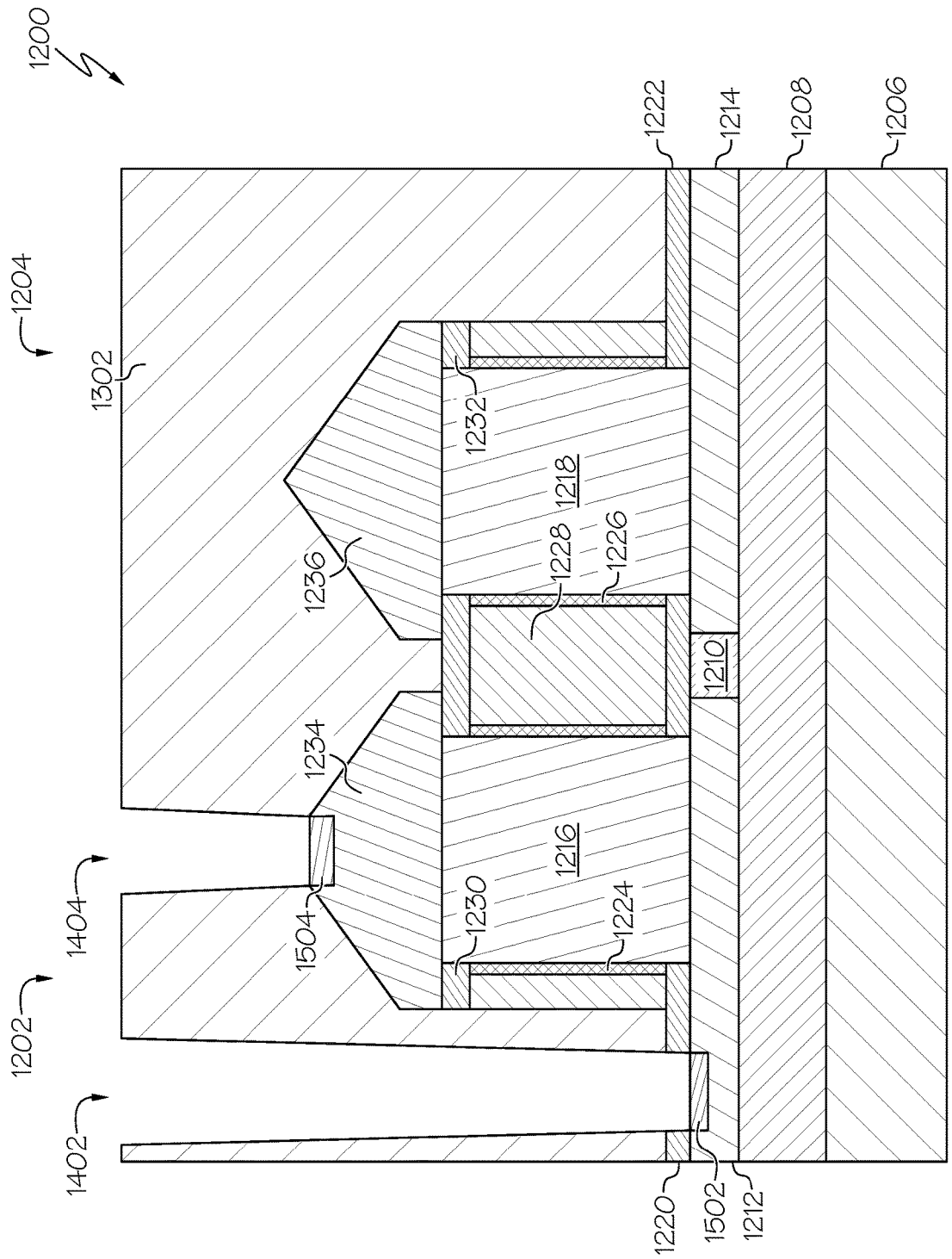
FIG. 15 is a cross-sectional view of the vertical FET semiconductor structure after silicide/germanide has been formed in contact with the exposed portions of the top source/drain and bottom source/drain in the NFET region according to one embodiment of the present invention.

An anneal is then performed to form a silicide 1502, 1504, as shown in FIG. 15. The silicide 1502, 1504 is formed on and in contact with the exposed portions of the bottom and top source/drain 1212, 1234 within the first and second contact openings 1402, 1404, respectively, resulting from the reaction of the contact metal layer(s) 1403, 1405 with the source/drain material. In one embodiment, the thickness of the silicide is 5 nm to 40 nm depending on the phase of the silicide. The result of the anneal is silicides or germanides 1502, 1504 of Ti, Ta, Hf, Zr, or Nb. In one embodiment, the silicides/germanides 1502, 1504 comprise carbon for enhanced agglomeration resistance. In one embodiment, carbon is implanted into the silicide/germanide 1502, 1504. Unreacted metal is then selectively removed from the structure 1200.

Figure 16:
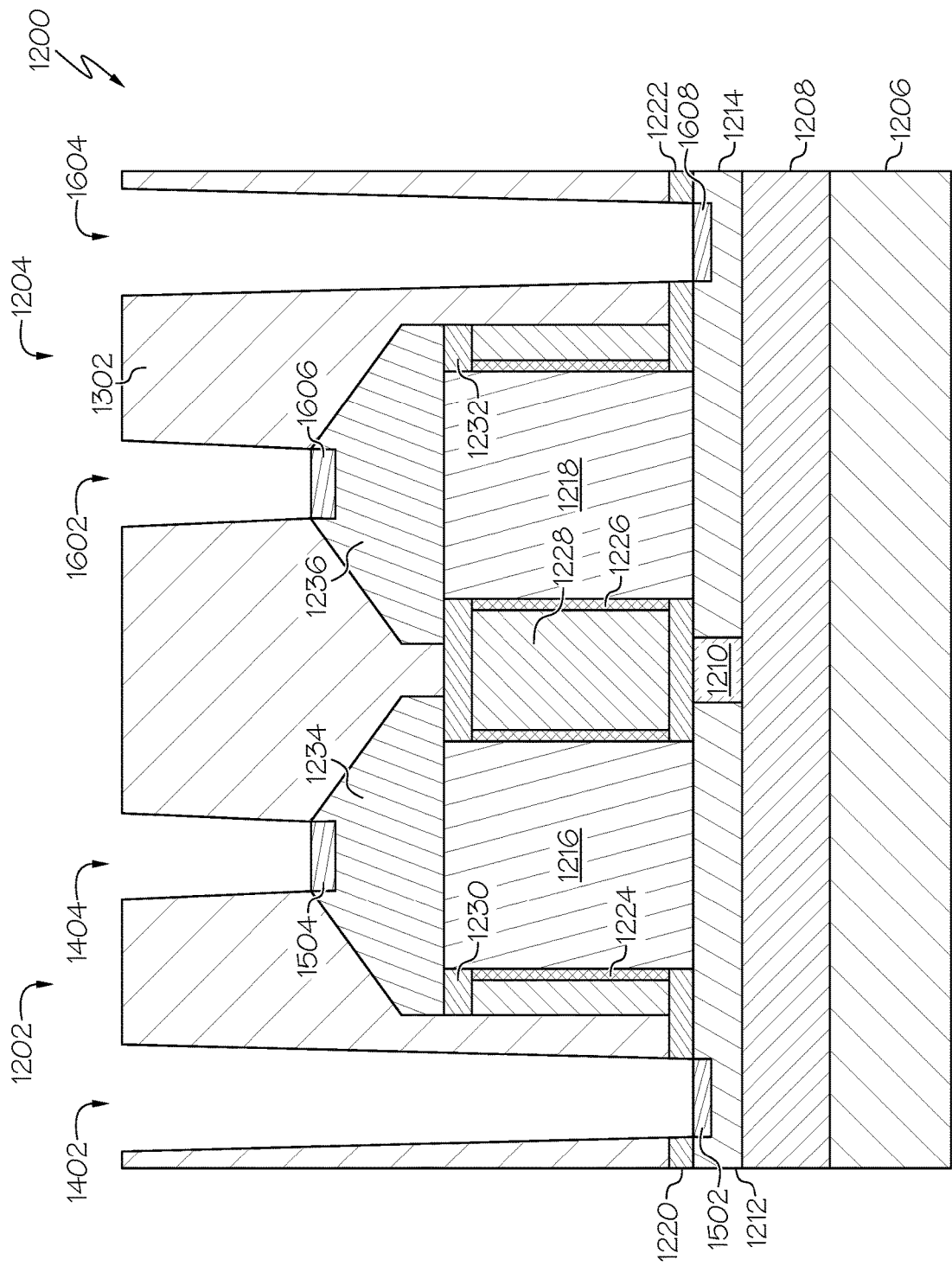
FIG. 16 is a cross-sectional view of the vertical FET semiconductor structure after contact trenches have been formed to expose a portion of the top source/drain and bottom source/drain in the PFET region and silicide/germanide has been formed in contact with the exposed portions of the top source/drain and bottom source/drain in the PFET region according to one embodiment of the present invention.

A similar process is performed in the PFET region 1204 to form third and fourth contact openings 1602, 1604 exposing portions of the bottom source/drain 1214 and top source/drains 1236, respectively, as shown in FIG. 16. During this process, the NFET region 1202 is masked off by filling the first and second contact openings 1402, 1404 and the remaining surfaces of the NFET region 1202 with masking material. One or more contact metal/metallic layers are then formed over the entire structure and an etch is performed to remove contact metal layer from all surfaces except the exposed portions of the bottom source/drain 1214 within the third contact opening 1602 and the exposed portions of the top source/drain 1236 within the fourth contact opening 1604. The contact metal layer(s) 902, in one embodiment, comprises titanium (Ti), tantalum (Ta), TiN, hafnium (Hf), zirconium (Zr), niobium (Nb), or alloys comprising carbon. However, other materials are applicable as well. In one embodiment, the sheet resistivity of the material(s) used for the contact metal layer(s) 902 is less than 50 μOhm/cm. In another embodiment, the contact metal layer 902 comprises one or more high melting point refractory metals such as molybdenum (Mo), ruthenium (Ru), vanadium (Va), tungsten (W), or the like. Carbon, in one embodiment, is formed/deposited similar to that already discussed above.

An anneal is then performed to form a silicide 1606, 1608. The silicide 1606, 1608 is formed on and in contact with the exposed portions of the bottom and top source/drain 1214, 1236 within the third and fourth contact openings 1602, 1604, respectively, resulting from the reaction of the contact metal layer(s) with the source/drain material. The result of the anneal is silicides of Ti, Ta, Hf, Zr, or Nb. The silicide 1606, 1608, in one embodiment, comprises carbon similar to that already discussed above. Unreacted metal is then selectively removed from the structure 1200. It should be be noted that if the same contact layer material(s) is being deposited for both NFET and PFET regions 1202, 1204 the first, second, third, and fourth contact openings can be formed during the same process and a single anneal can be performed to form the silicides 1502, 1504, 1606, 1608. Also, after the silicide (or germanide) 1502, 1504, 1606, 1608 has been formed, an optional implantation process can be performed through the silicide (or germanide) 1502, 1504, 1606, 1608 in both regions.

Figure 17:
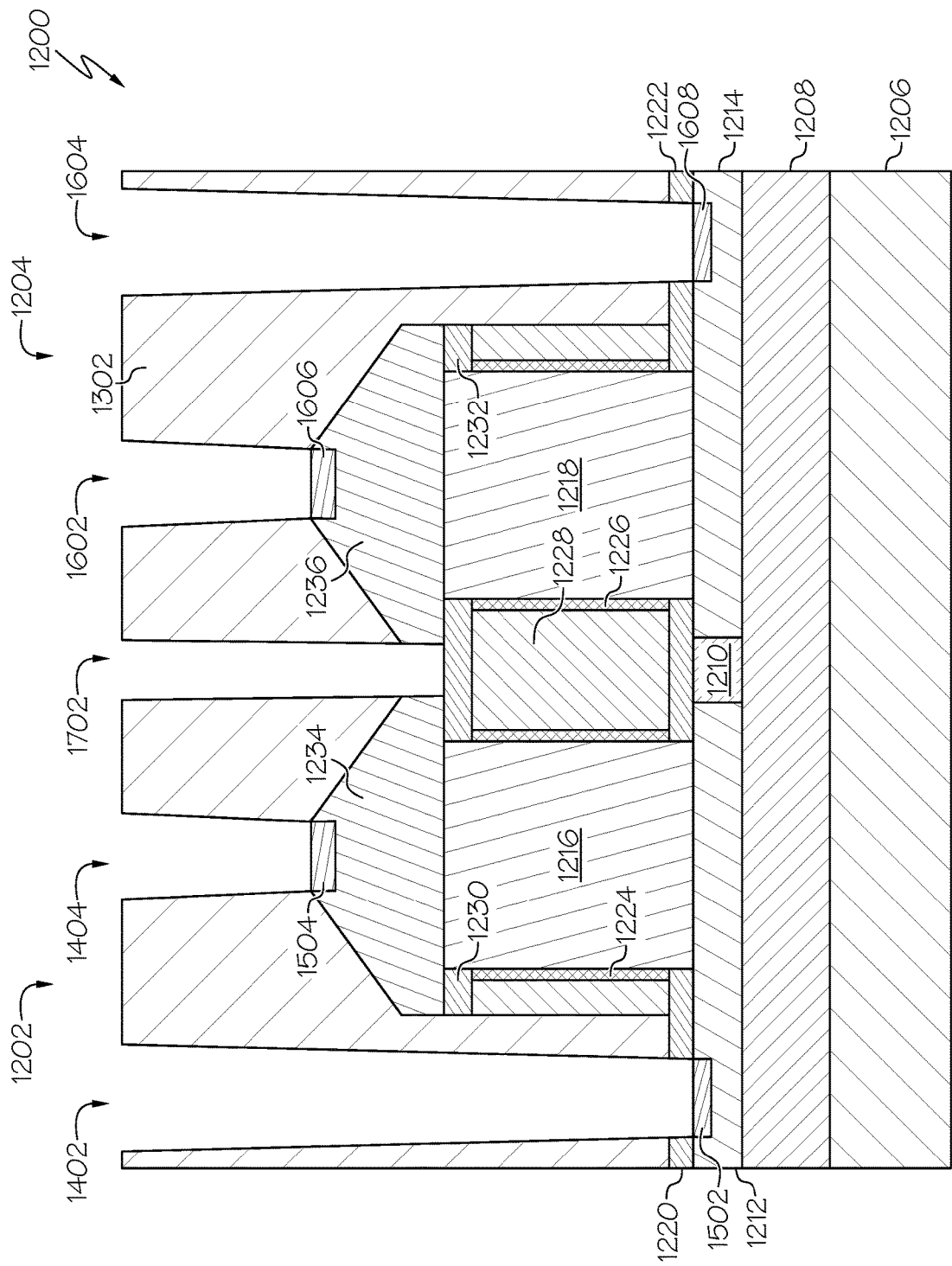
FIG. 17 is a cross-sectional view of the vertical FET semiconductor structure after a contact trench has been formed over the gate according to one embodiment of the present invention.
Figure 18:
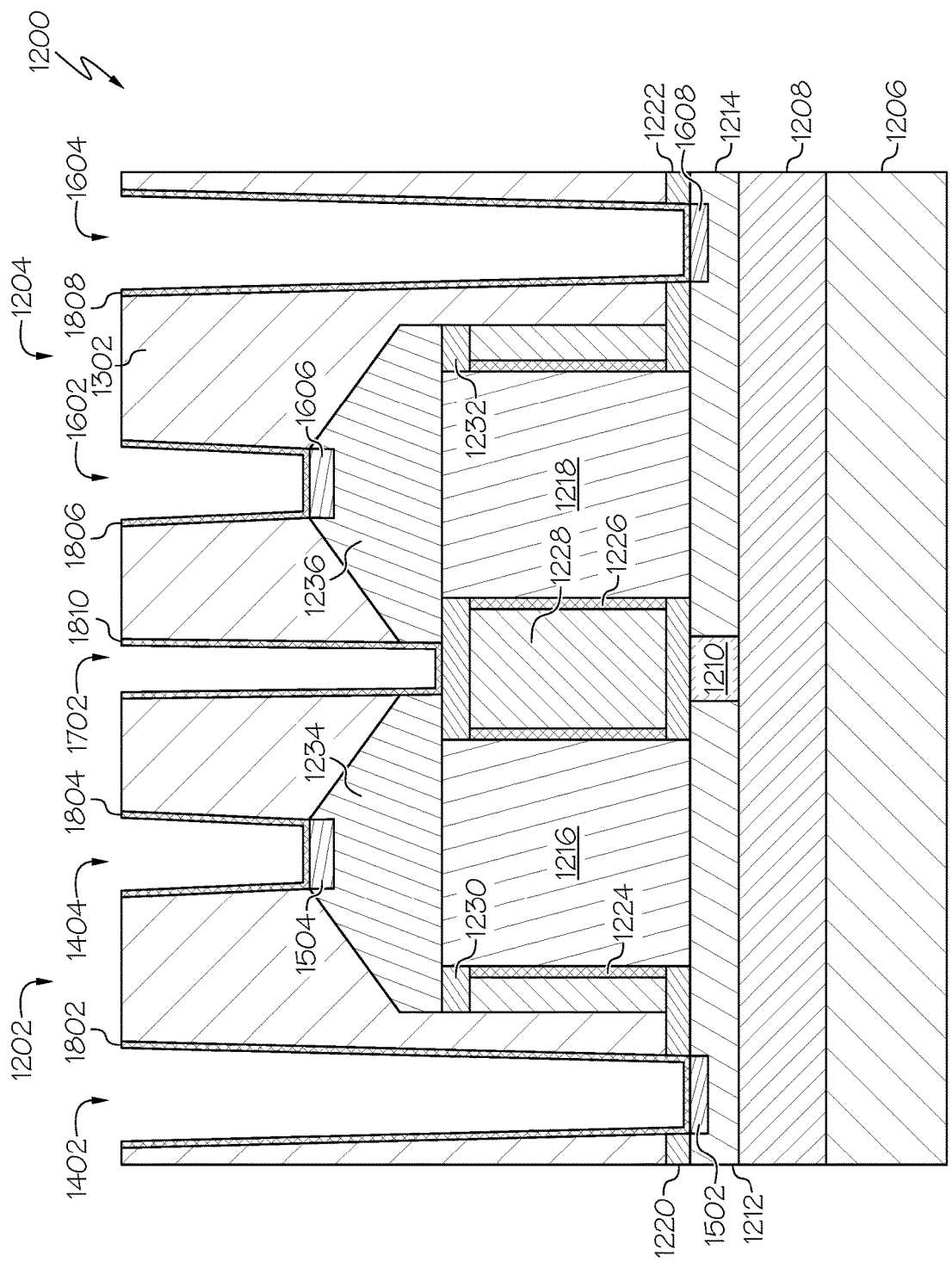
FIG. 18 is a cross-sectional view of the vertical FET semiconductor structure after a contact liner has been formed on the sidewalls of each contact trench and in contact with the silicides/germanides according to one embodiment of the present invention.

FIG. 17 shows that after the contact silicides 1502, 1504, 1606, 1608 have been formed, any exposed contact openings 1602, 1604 are masked and a fifth trench 1702 is formed in the dielectric layer 1302 using using lithography, patterning, and etching techniques. The fifth trench 1702 exposes a portion of the top spacer 1230 between the NFET and PFET regions 1202, 1204 that is in contact with the gate 1228. Once the first trench 1702 has been formed, any masking material is removed from the structure 1200 using one or more etching processes.

In one embodiment, if the contact metal (or conductive contact) is to comprise tungsten, which has poor adhesion to the underlying layers, contact openings 1402, 1404, 1602, 1604, 1702 are lined with one or more contact liners 1802, 1804, 1806, 1808, 1810. As used herein "contact liners" refers generally to any film or layer which forms part of the resultant contact structure, and includes one or more conformally-deposited high resistive contact liners, such as a gettering layer, and a barrier/adhesive layer disposed over gettering layer. Gettering layer can be deposited, to ensure that oxygen (for instance, formed due to exposure of the underlying silicide to ambient conditions), remaining after various post pre-clean conditions such as, for example, argon (Ar) sputter, SiCoNi dry etch conditions, is gettered of the underlying silicide layer and also to decrease subsequent contact resistance. Gettering layer, which can be deposited using conventional process(es) such as, for example, ionized metal plasma (IMP), or physical vapor deposition processes, for example, radio-frequency physical vapor deposition (RFPVD), can have a thickness of about 2 nanometers to about 8 nanometers, and be fabricated of, for example, ruthenium (Ru), an alloy of ruthenium, titanium (Ti), an alloy of titanium, tantalum (Ta), an alloy of tantalum, and the like.

A Barrier/adhesive layer (not shown), in one embodiment, is deposited over the gettering layer to, for instance, protect the gettering layer from eroding on exposure to harsher chemistries typically employed during subsequent contact metallization, as well as to prevent oxidation due to exposure to air. The Barrier/adhesive layer is deposited using conventional deposition processes, such as, for example, physical vapor deposition (PVD), chemical vapor deposition (CVD), pulsed CVD, plasma-enhanced CVD (PECVD), metal organic chemical vapor deposition (MOCVD), atomic layer deposition (ALD), plasma-enhanced ALD (PE-ALD) or sputtering methods, and has a thickness of about 1 nanometers to about 3 nanometers. In one example, the barrier/adhesive layer includes, titanium-based materials (e.g., TiN, TiC, TiCN, TiSiN), or tantalum-based materials (e.g., TaN, TaC, TaCN, TaSiN) or fluorine-free tungsten-based materials (e.g., WN, WC, WCN, WSiN). It should be noted that the use of a fluorine-free tungsten-based nucleation layer may eliminate the need for additional adhesive layers such as, for example, titanium-based materials (e.g., TiN), as fluorine-free tungsten-based nucleation layers are known in the art to be good barrier/adhesive layers as well. In a specific example, titanium nitride (TiN) is formed using a titanium precursor, such as, for example, tetrakis(dimethylamino) titanium (TDMAT) or titanium tetrachloride (TiCl.sub.4) and a reagent plasma, such as, for example, nitrogen plasma during a plasma-enhanced ALD (PE-ALD) process.

Figure 19:
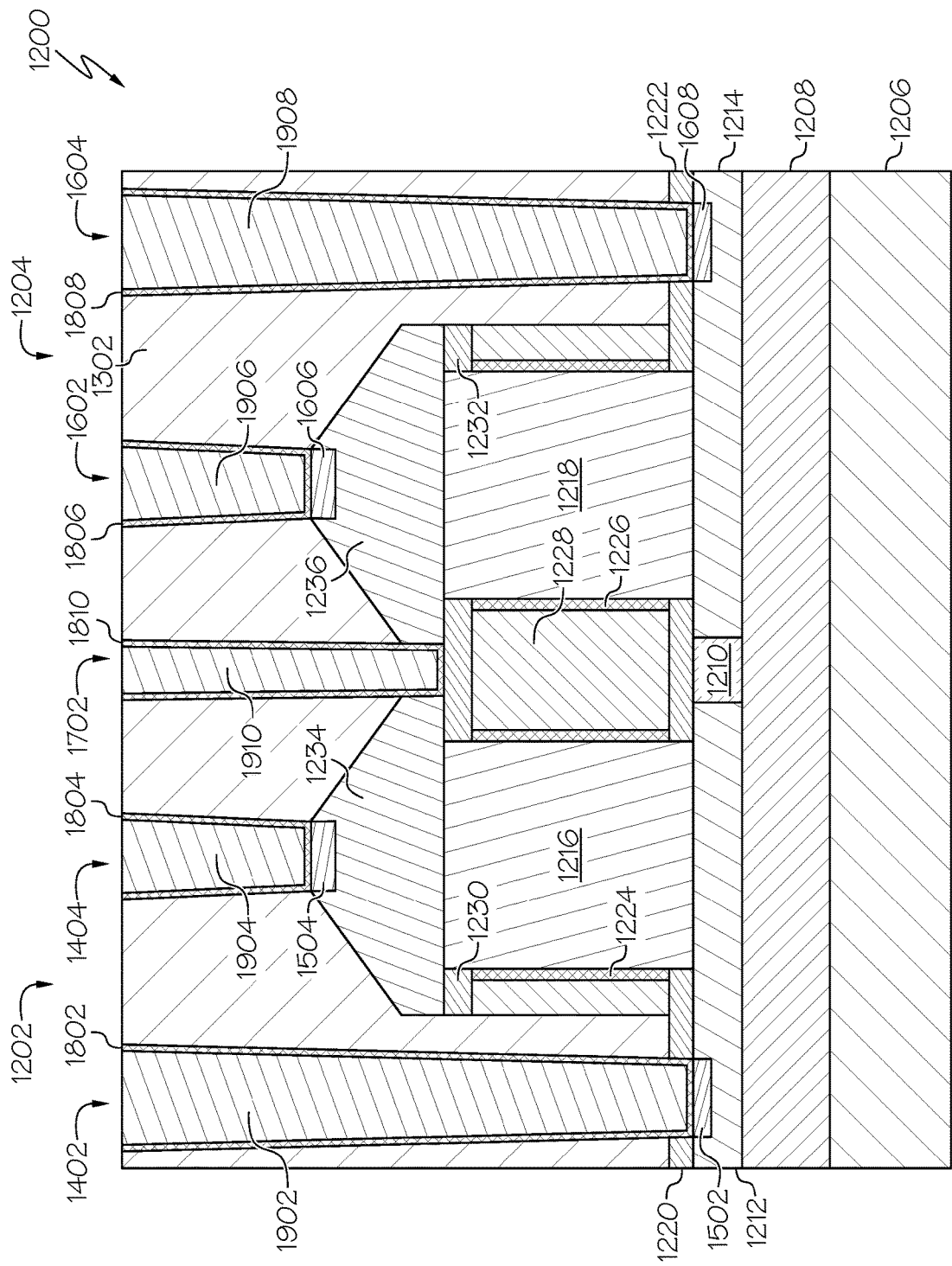
FIG. 19 is a cross-sectional view of the vertical FET semiconductor structure after a metal contact has been formed within each of the contact trenches according to one embodiment of the present invention.

Contact structures 1902, 1904, 1906, 1908, 1910 are then formed in the contact openings 1402, 1404, 1602, 1604, 1702, as shown in FIG. 19. In one embodiment, the contact structures are formed by providing a conductive contact material over the contact liners (if formed) within the contact openings. The conductive material, in one embodiment, includes (but is not limited to) tungsten, copper, aluminum, silver, gold, and alloys thereof.

If the contact material is tungsten, a nucleation layer (not shown) can be deposited over the liners 1802 to 1810 to facilitate the subsequent formation of the bulk tungsten material, using conventional deposition processes such as chemical vapor deposition (CVD), atomic layer deposition (ALD) or pulsed nucleation layer deposition (PNL) deposition processes. The thickness of the nucleation layer, in one embodiment, is deposited by, for instance, performing alternating pulsing sequences of boron-containing reducing agent and tungsten-containing precursor in presence of a reducing agent. The boron-containing reducing agents include, but are not limited to borane, diborane, triborane, boron halides such as, for example, boron trifluoride, boron, and the like. The tungsten-containing precursors can include tungsten-containing gases such as, for example, $WF_6$, $WCl_6$ and $W(CO)_6$, and the like, while the reducing agents can include hydrogen gas, silane, disilane, hydrazine, and germane. In a specific example, the bulk deposition process involves a chemical vapor deposition (CVD) reaction of tungsten-containing precursor, such as tungsten hexafluoride, and reducing gases, such as hydrogen to produce tungsten and a by-product, such as, for example, hydrogen hexafluoride (HF) at temperature of about 250° C. to about 400° C. Any excess contact liners material and excess conductive contact material are polished away.

Figure 20:
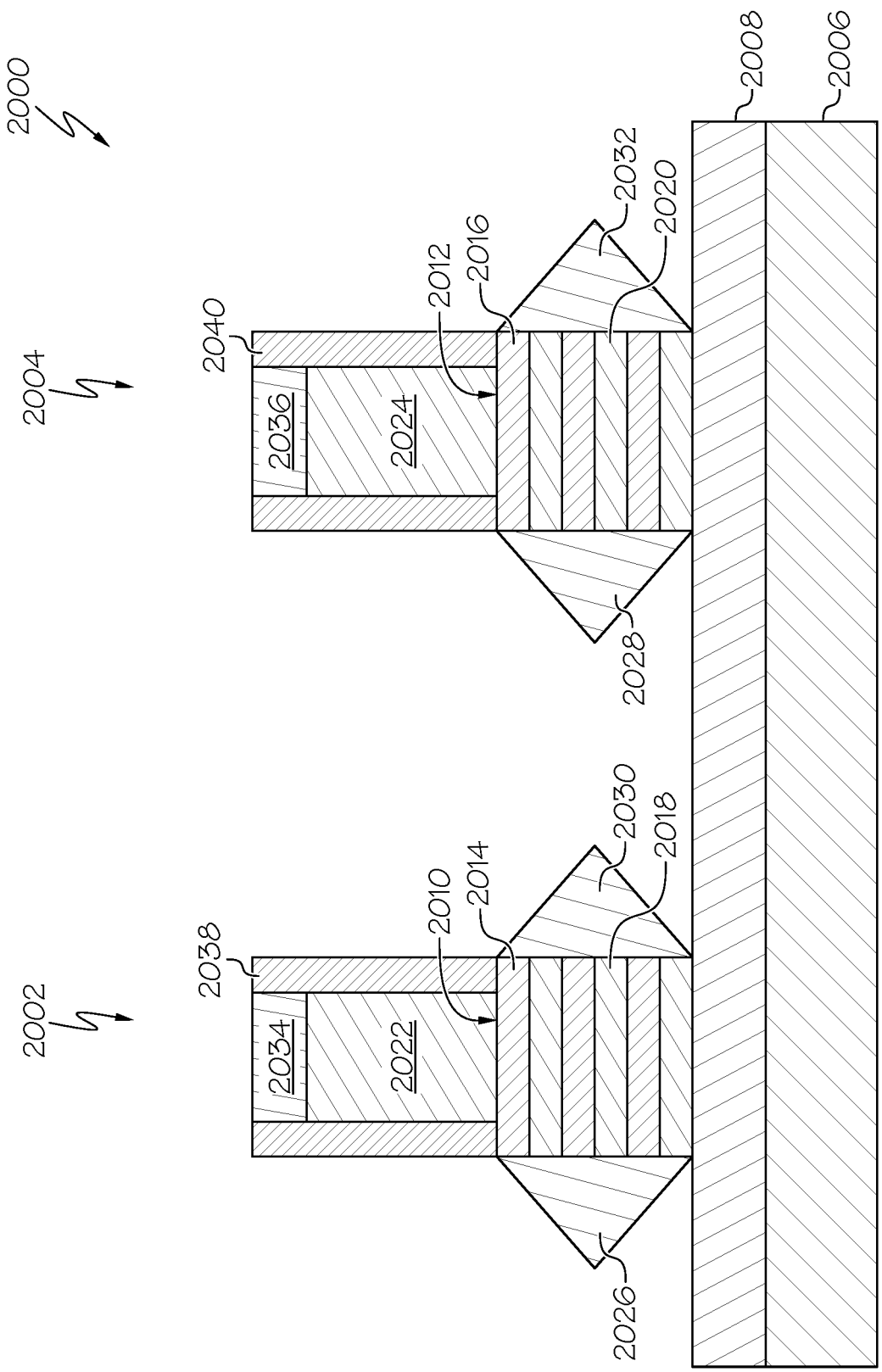
FIG. 20 is a cross-sectional view of an initial nano-sheet semiconductor structure after metal gates have been formed in the NFET and PFET regions according to one embodiment of the present invention.

FIG. 20 shows another example of a semiconductor structure 2000 applicable to embodiments of the present invention. In particular, FIG. 20 shows one example of a nano-sheet semiconductor structure 2000 at a starting point for embodiments of the present invention. In this example, one or more embodiments begin after source/drain regions have been epitaxially formed. It should be noted that embodiments of the present invention are not limited to the particular nano-sheet device structure shown in FIG. 20. Embodiments of the present invention are applicable to nano-sheet device structure and methods for fabricating the same.

In the example shown in FIG. 20, the structure 200 comprises an NFET region 2002 and a PFET region 2004. Both of these regions are formed on a substrate 2006 and an insulator layer 2008. The handle substrate 2006, in one embodiment, includes a semiconductor material, an insulator material, a conductive material, or a combination thereof. The thickness of the handle substrate 2006, in one embodiment, ranges from 50 microns to 2 mm, although lesser and greater thicknesses can also be employed. The insulator layer 2008 includes a dielectric material such as silicon oxide, silicon nitride, silicon oxynitride, or a combination thereof. The insulator layer 2008, in one embodiment, has a thickness ranging from 5 nm to 500 nm, although lesser and greater thicknesses can also be employed.

The structure 2000 of FIG. 20 also comprises a first stack 2010 formed in the NFET region 2002 and a second stack 2012 formed in the PFET region 2004. Each of these stacks 2010, 2012 comprises alternating layers of a semiconductor material 2014, 2016 (e.g., nano-sheets) and a gate material 2018, 2020. In one embodiment, the alternating layers of the semiconductor material 2014, 2016 include a silicon-containing semiconductor material. Examples of silicon-containing semiconductor materials include pure, i.e., unalloyed, silicon, carbon doped silicon (Si:C), or a silicon germanium alloy having a germanium content of "significantly" less germanium (i.e., 30% or more germanium content difference). However, other materials and concentrations are applicable as well.

In one embodiment, the alternating layers of the gate material 2018, 2020 comprise a conductive material used to form at least the gate conductor portion of a gate 2022, 2024 formed on an in contact with each of the stacks 2010, 2014. The gate material 2018, 2020 comprises any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. The conductive material can also be an NFET or a PFET gate metal.

The structure 2000 further comprises source regions 2026, 2028 and drain regions 2030, 2032 that have been epitaxially grown on and in contact with the first and second stacks 2010, 2012. In one embodiment, the source regions 2026, 2028 and drain regions 2030, 2032 have a "diamond-shaped/cross-section" resulting from the epitaxy growth process. It should be noted that, in other embodiments, the source regions 2026, 2028 and drain regions 2030, 2032 do not include a diamond-shaped/cross-section and has a planar configuration.

The gate structures 2022, 2024 are formed on and in contact with their respective stack 2010, 2012, and are comprised of the gate material 2018, 2020 discussed above. The gate structures 2022, 2024 wrap around the semiconductor layers 2014, 2016 of the stacks 2010, 2012. In one embodiment, the gate structures 2022, 2024 also comprise a dielectric material (not shown). The dielectric material comprises, for example, oxide, nitride, and/or oxynitride. In one example, the gate dielectric material is a high-k material having a dielectric constant greater than silicon dioxide. Examples of high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. It should be noted that although FIG. 20 shows a replacement gate structure 2022, 2024, embodiments of the present invention can be performed prior to removal of the disposable gate.

FIG. 20 further shows that a cap layer 2034, 2036 is formed on and in contact with a top surface of the gate structures 2022, 2024. The cap layers 2034, 2036, in one embodiment, comprise a dielectric material such as silicon nitride, silicon oxide, or a dielectric metal oxide. Gate spacers 2038, 2040 are formed around (wrapping) each of the gate structures 2022, 2024. The gate spacers 2038, 2040, in one embodiment comprise a dielectric material layer.

Figure 21:
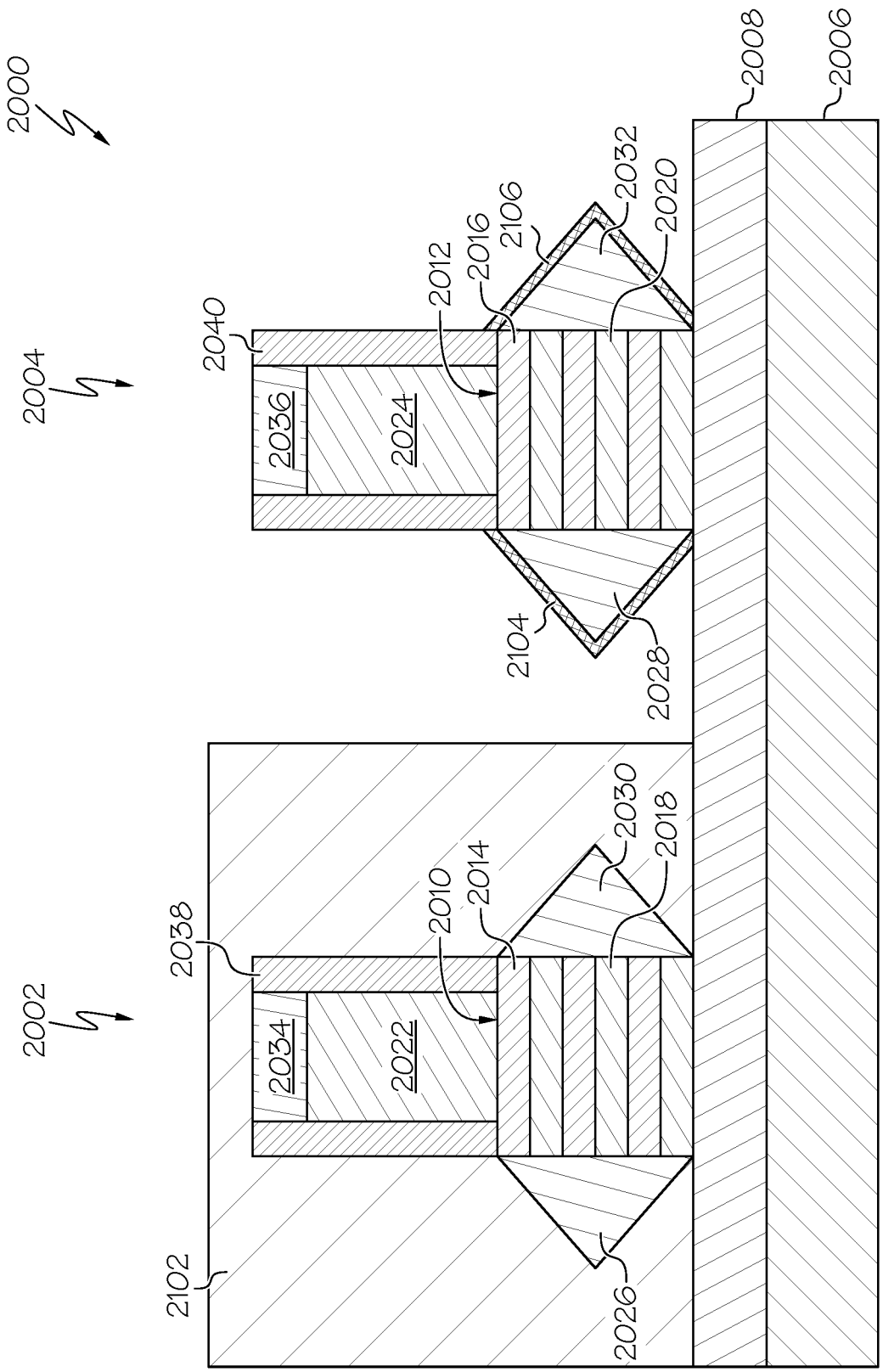
FIG. 21 is a cross-sectional view of the nano-sheet semiconductor structure after the NFET region has been masked off and a contact metal layer has been formed on the epitaxially grown source/drain regions in the PFET region according to one embodiment of the present invention.

After the structure in FIG. 20 has been formed, the NFET region 2002 is masked off. For example, a masking material is deposited followed by lithography and etching such that only the NFET region 2002 is covered by a mask 2102 while the PFET region 2004 is left exposed, as shown in FIG. 21. One or more contact metal/metallic layers are then formed over the entire structure and. An etch is performed resulting in contact metal layers 2014, 2016 remaining only on the source region 2028 and the drain region 2032 of the PFET device. The contact metal layer(s) 2104, 2106, in one embodiment, is formed by chemical vapor deposition (CVD), physical vapor deposition (PVD), atomic layer deposition (ALD), or any combination thereof. The contact metal layer(s) 902, in one embodiment, comprises titanium (Ti), tantalum (Ta), TiN, hafnium (Hf), zirconium (Zr), niobium (Nb), or alloys comprising carbon. However, other materials are applicable as well. In one embodiment, the sheet resistivity of the material(s) used for the contact metal layer(s) 2014, 2016 is less than 50 μOhm/cm. In another embodiment, the contact metal layer 2014, 2016 comprises one or more high melting point (e.g., greater than 1500° C.) refractory metals such as molybdenum (Mo), ruthenium (Ru), vanadium (Va), tungsten (W), or the like. In one embodiment, the thickness of the contact metal layer(s) 2014, 2016 is 3 nm to 15 nm, although lesser or greater thicknesses apply.

In one embodiment, an interlayer (not shown) comprising carbon can be formed on and in contact with a top surface of the source region 2028 and the drain region 2032 prior to forming the contact metal layer 2014, 2016. For example, a pure metal(s), metal carbide, alloy, etc. comprising carbon can be deposited by CVD, PVD, ALD, or any combination thereof to form the carbon-based interlayer. Alternatively, or in addition to, carbon is added through incorporation in the contact metal layer 2104, 2106. For example, carbon can be added during formation of the contact metal layer utilizing, for example, an alloy target, change in CVD/ALD precursor, implantation into the contact metal layer 2104, 2106, and/or the like.

Figure 22:
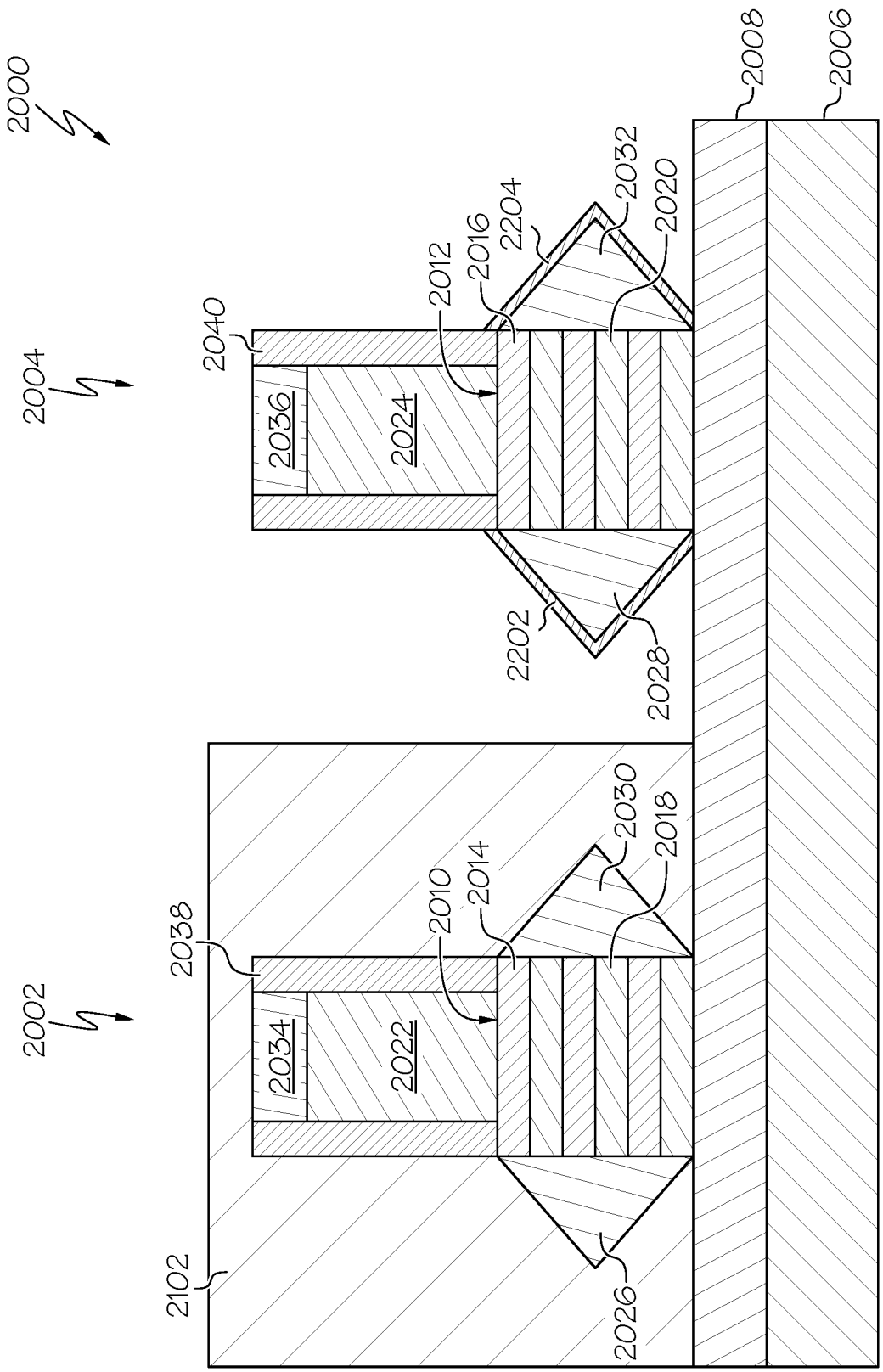
FIG. 22 is a cross-sectional view of the nano-sheet semiconductor structure after silicide/germanide has been formed in contact and surrounding the epitaxially grown source/drain regions in the PFET region according to one embodiment of the present invention.

An anneal is then performed to form a silicide 2202, 2204, as shown in FIG. 22. The silicide 2202, 2204 is formed in contact with and wraps around the source region 2028 and the drain region 2032, resulting from the reaction of the contact metal layer(s) with the source/drain material. In one embodiment, the thickness of the silicide is 5 nm to 40 nm depending on the phase of the silicide. The result of the anneal is silicides or germanides 2202, 2204 of Ti, Ta, Hf, Zr, or Nb. In one embodiment, the silicides/germanides 2202, 2204 comprise carbon for enhanced agglomeration resistance. In one embodiment, carbon is implanted into the silicide/germanide 2202, 2204. Unreacted metal is then selectively removed from the structure 2000.

Figure 23:
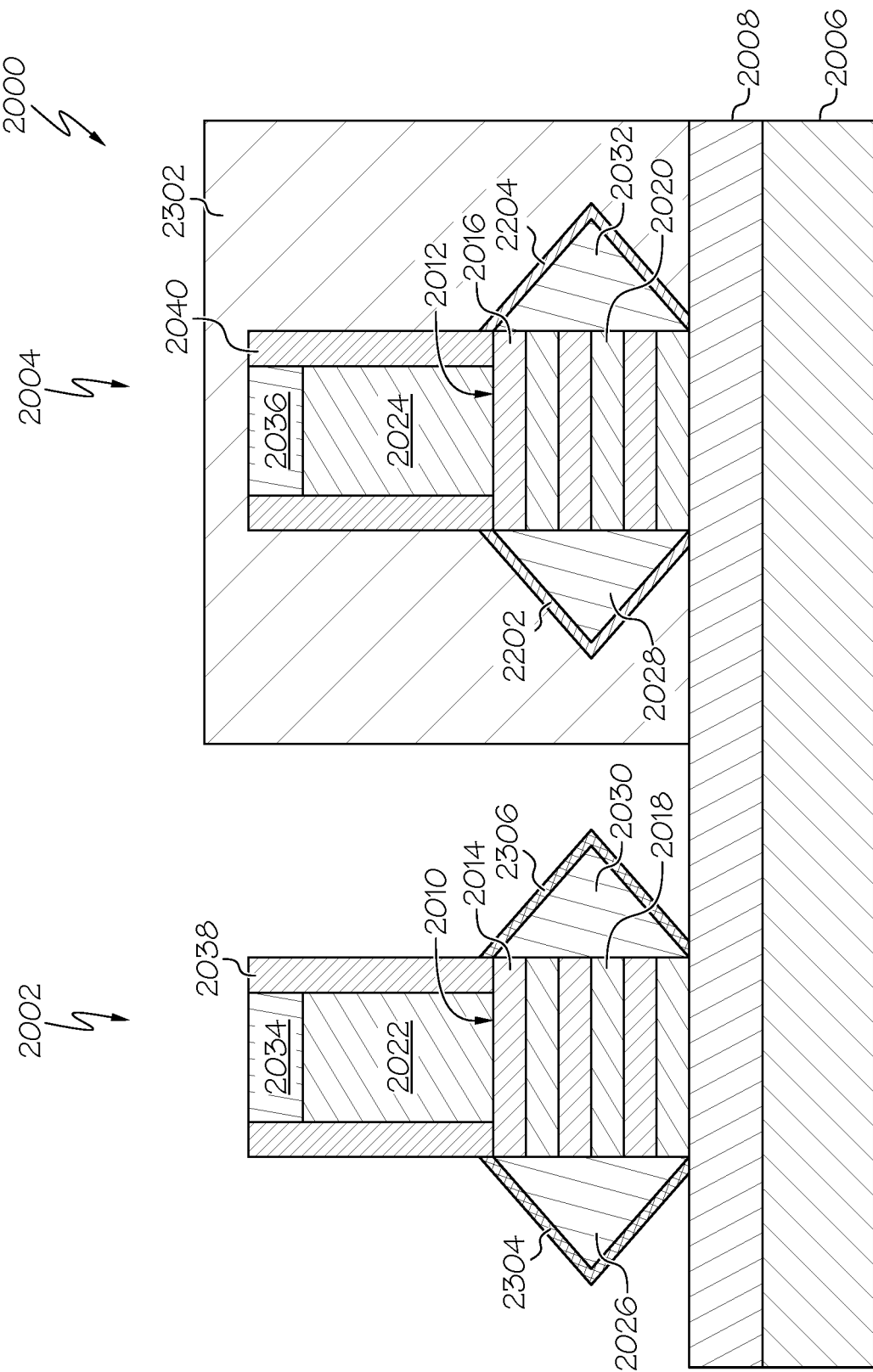
FIG. 23 is a cross-sectional view of the nano-sheet semiconductor structure after the PFET region has been masked off and a contact metal layer has been formed on the epitaxially grown source/drain regions in the NFET region according to one embodiment of the present invention.

A similar process is then performed to form silicides/germanides in the NFET region 2002. For example, the PFET region 2004 is masked off. For example, a masking material is deposited followed by lithography and etching such that only the PFET region 2004 is covered by a mask 2302 while the NFET region 2002 is left exposed, as shown in FIG. 23. One or more contact metal/metallic layers are then formed over the entire structure and. An etch is performed resulting in contact metal layers 2304, 2306 remaining only on the source region 2026 and the drain region 2030 of the NFET device. The contact metal layer(s) 2304, 2306, in one embodiment, is formed by chemical vapor deposition (CVD), physical vapor deposition (PVD), atomic layer deposition (ALD), or any combination thereof. The contact metal layer(s) 2304, 2306, in one embodiment, comprises titanium (Ti), tantalum (Ta), TiN, hafnium (Hf), zirconium (Zr), niobium (Nb), or alloys comprising carbon. However, other materials are applicable as well. In one embodiment, the sheet resistivity of the material(s) used for the contact metal layer(s) 2304, 2306 is less than 50 μOhm/cm. In another embodiment, the contact metal layer 2304, 2306 comprises one or more high melting point refractory metals such as molybdenum (Mo), ruthenium (Ru), vanadium (Va), tungsten (W), or the like. In one embodiment, the thickness of the contact metal layer(s) 2304, 2306 is 3 nm to 15 nm, although lesser or greater thicknesses apply.

In one embodiment, an interlayer (not shown) comprising carbon can be formed on and in contact with a top surface of the source region 2026 and the drain region 2030 similar to that discussed above. Alternatively, or in addition to, carbon is added through incorporation in the contact metal layer 2304, 2306 as discussed above.

Figure 24:
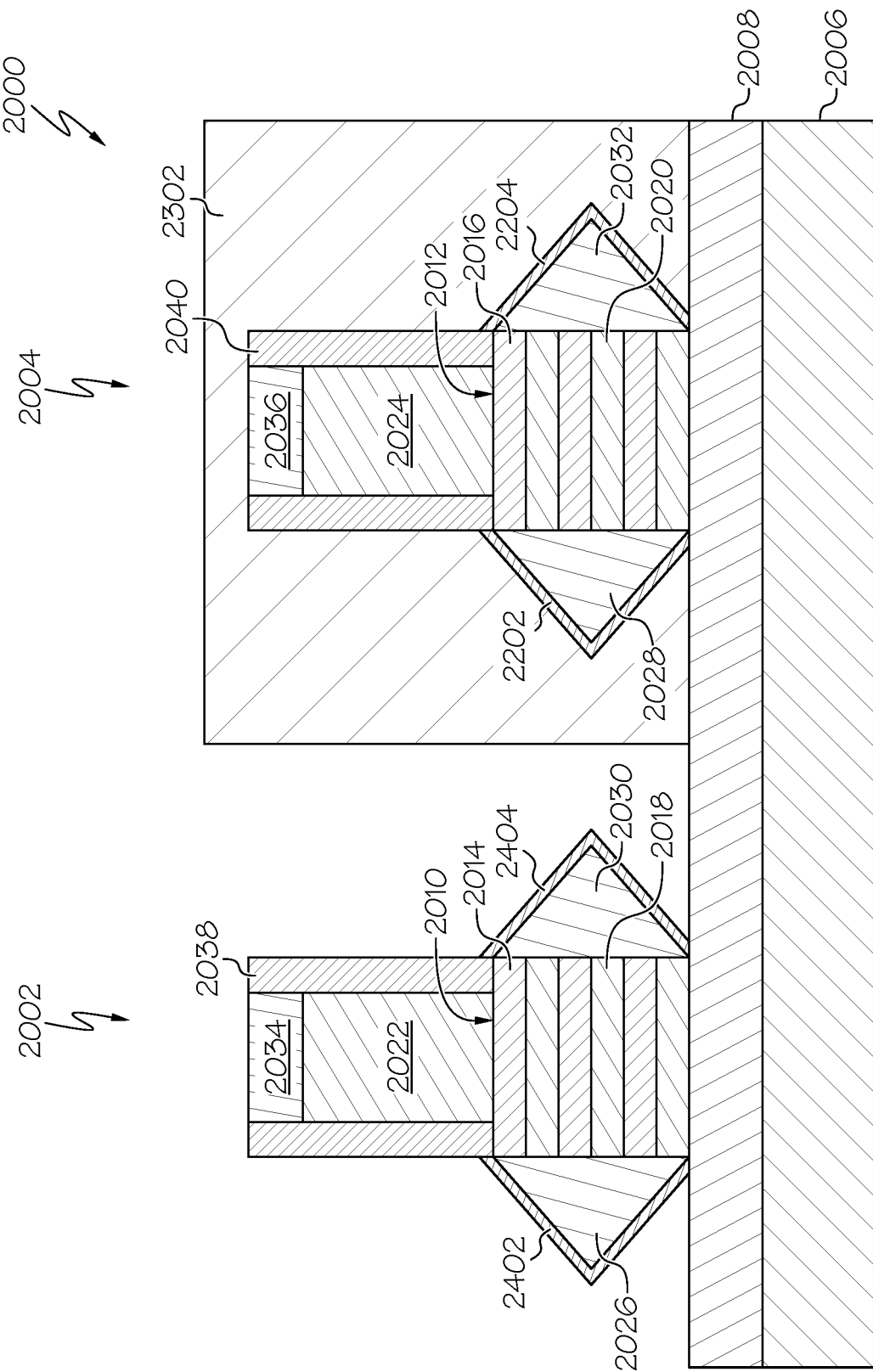
FIG. 24 is a cross-sectional view of the nano-sheet semiconductor structure after silicide/germanide has been formed in contact and surrounding the epitaxially grown source/drain regions in the NFET region according to one embodiment of the present invention.
Figure 25:
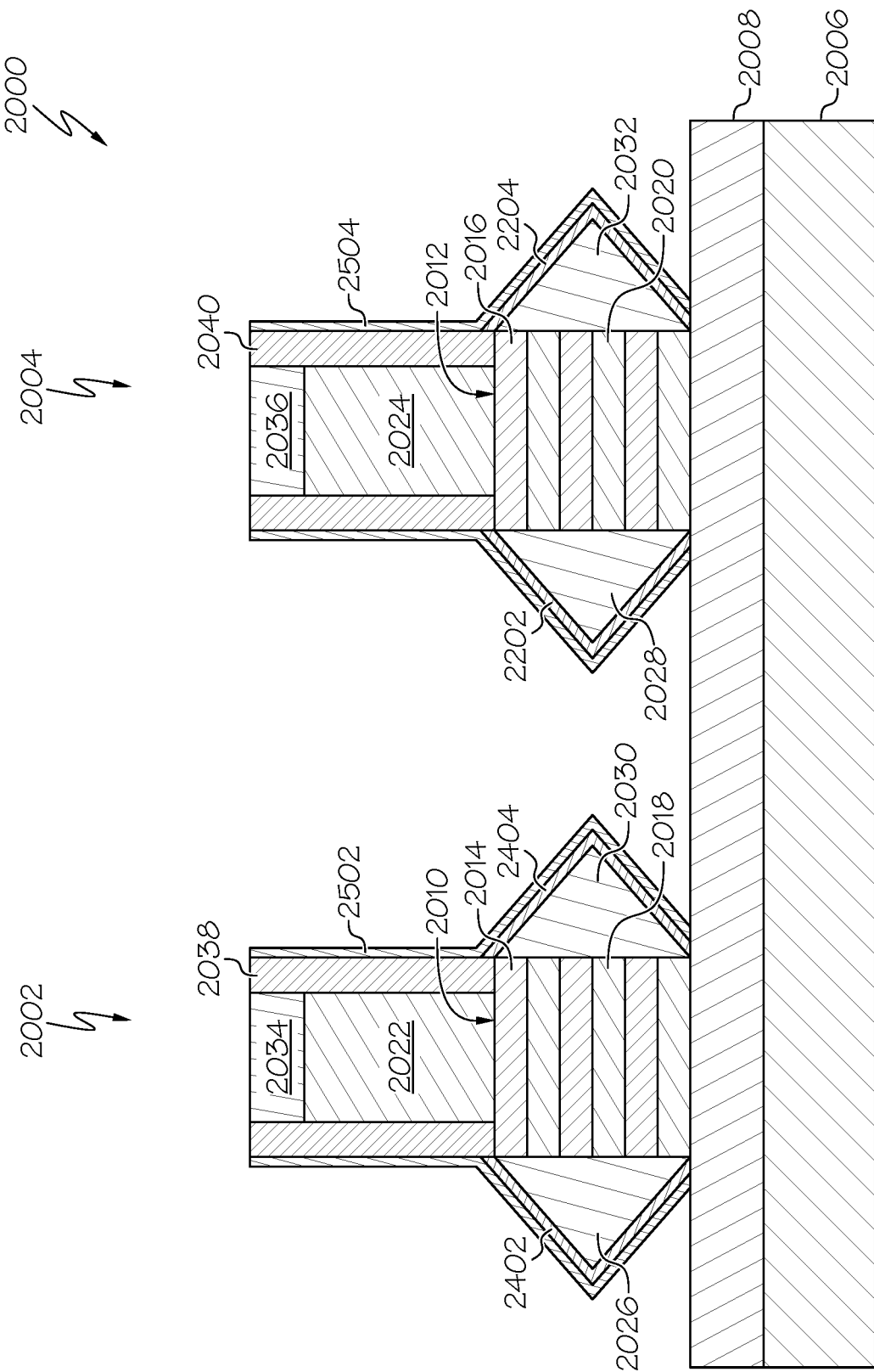
FIG. 25 is a cross-sectional view of the nano-sheet semiconductor structure after a contact liner has been formed in contact with at least the spacers and the silicide/germanide in each of the NFET and PFET regions according to one embodiment of the present invention.

An anneal is then performed to form a silicide 2402, 2404, as shown in FIG. 24. The silicide 2402, 2406 is formed in contact with and wraps around the source region 2026 and the drain region 2030, resulting from the reaction of the contact metal layer(s) with the source/drain material. The result of the anneal is silicides or germanides 2402, 2406 of Ti, Ta, Hf, Zr, or Nb. In one embodiment, the silicides/germanides 2402, 2406 comprise carbon for enhanced agglomeration resistance. In one embodiment, carbon is implanted into the silicide/germanide 2402, 2404. Unreacted metal is then selectively removed from the structure 2000. After the silicide (or germanide) 2202, 2204, 2402, 2404 has been formed, an optional implantation process can be performed through the silicide (or germanide) 2202, 2204, 2402, 2404 in both regions.

A contact liner 2502, 2504, such as the liner discussed above with respect to FIG. 18, is then formed on and in contact with the NFET and PFET devices. The contact liner 2502, 2504 is formed on and in contact with the source region 2026, 2028; the drain region 2030, 2032; and the gate spacers 2038, 2040 of the NFET and PFET devices. Conventional fabrication processes can then be performed to form contacts and complete fabrication of the devices.

Figure 26:
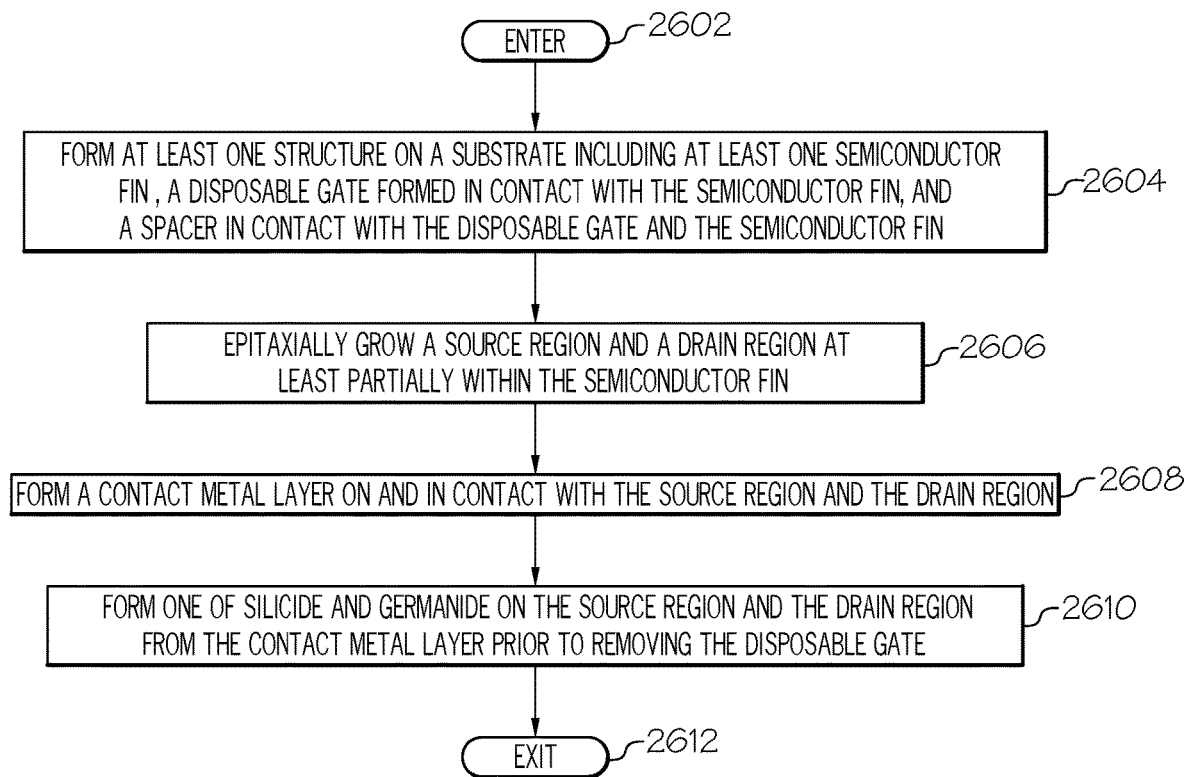
FIG. 26 is an operational flow diagram illustrating one process for fabricating finFET semiconductor structures according to one embodiment of the present invention.

FIG. 26 is an operational flow diagram illustrating one process for fabricating a finFET semiconductor structure. It should be noted that each of the steps shown in FIG. 26 has been discussed in greater detail above with respect to FIGS. 1-11. In FIG. 26, the operational flow diagram begins at step 2602 and flows directly to step 2604. At least one structure, at step 2604, is formed on a substrate including at least one semiconductor fin, a disposable gate formed in contact with the semiconductor fin, and a spacer in contact with the disposable gate and the semiconductor fin. A source region and a drain region are epitaxially grown at least partially within the semiconductor fin, at step 2606. A contact metal layer, at step 2608, is formed on and in contact with the source region and the drain region. One of a silicide and a germanide, at step 2610, is formed on the source region and the drain region from the contact metal layer prior to removing the disposable gate, forming. The control flow then exits at step 2612.

Figure 27:
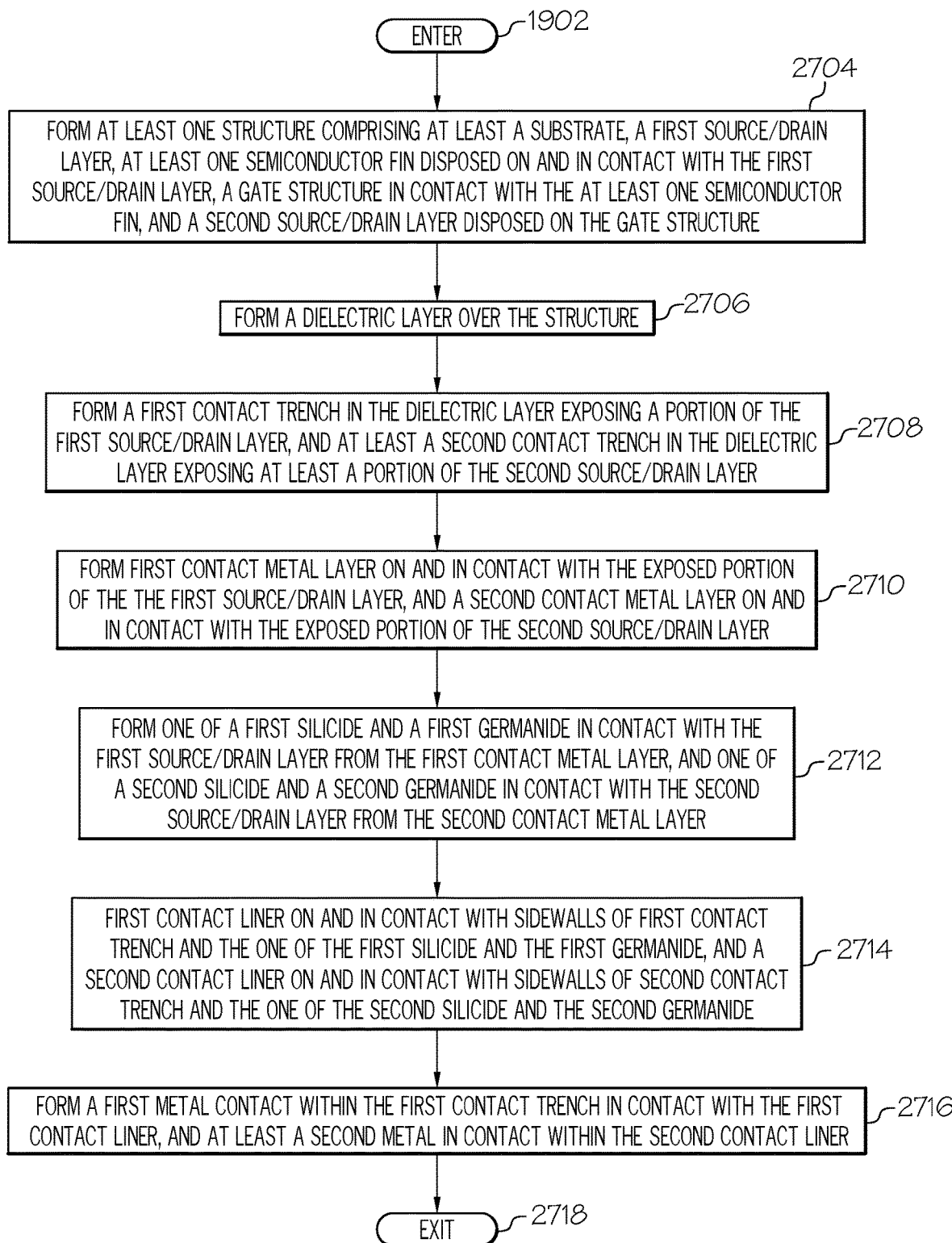
FIG. 27 is an operational flow diagram illustrating one process for fabricating vertical FET semiconductor structures according to one embodiment of the present invention.

FIG. 27 is an operational flow diagram illustrating one process for fabricating a vertical FET semiconductor structure. It should be noted that each of the steps shown in FIG. 27 has been discussed in greater detail above with respect to FIGS. 12-19. In FIG. 27, the operational flow diagram begins at step 2702 and flows directly to step 2704. A structure, at step 2704, is formed including at least a substrate, a first source/drain layer, at least one semiconductor fin disposed on and in contact with the first source/drain layer, a gate structure in contact with the at least one semiconductor fin, and a second source/drain layer disposed on the gate structure.

A dielectric layer, at step 2706, is formed over the structure. A first contact trench is formed in the dielectric layer exposing a portion of the first source/drain layer, and at least a second contact trench is formed in the dielectric layer exposing at least a portion of the second source/drain layer, at step 2708. A first contact metal layer is formed on and in contact with the exposed portion of the the first source/drain layer, and a second contact metal layer is formed on and in contact with the exposed portion of the second source/drain layer, at step 2710.

One of a first silicide and a first germanide is formed in contact with the first source/drain layer from the first contact metal layer, and one of a second silicide and a second germanide is formed in contact with the second source/drain layer from the second contact metal layer, at step 2712. A first contact liner is formed on and in contact with sidewalls of the first contact trench and the one of the first silicide and the first germanide, and a second contact liner is formed on and in contact with sidewalls of second contact trench and the one of the second silicide and the second germanide, at step 2714. A first metal contact is formed within the first contact trench in contact with the first contact liner, and at least a second metal is formed in contact within the second contact liner, at step 2716. The control flow then exits at step 2718 where conventional fabrication techniques are performed to complete the fabrication of the vertical FET semiconductor structure.

Figure 28:
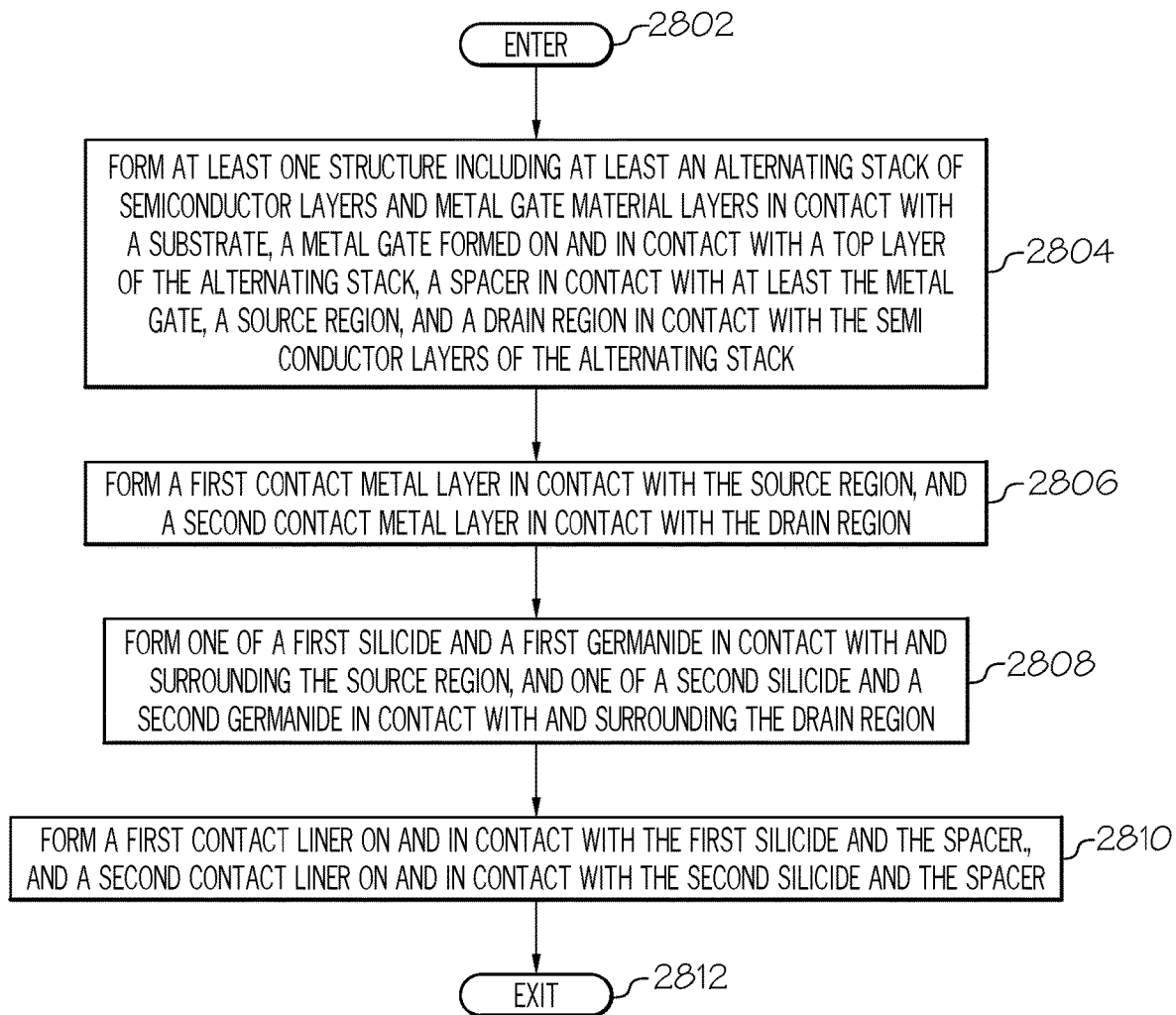
FIG. 28 is an operational flow diagram illustrating one process for fabricating nano-sheet semiconductor structures according to one embodiment of the present invention and FIG. 29 is a cross-sectional view of the vertical FET semiconductor structure after a carbon interlayer and a contact metal/metallic layer has been formed within contact trenches in the NFET region according to one embodiment of the present invention.

FIG. 28 is an operational flow diagram illustrating one process for fabricating a nano-sheet semiconductor structure. It should be noted that each of the steps shown in FIG. 28 has been discussed in greater detail above with respect to FIGS. 20-25. In FIG. 28, the operational flow diagram begins at step 2802 and flows directly to step 2804. A structure, at step 2804, is formed including at least an alternating stack of semiconductor layers and metal gate material layers in contact with a substrate, a metal gate formed on and in contact with a top layer of the alternating stack, a spacer in contact with at least the metal gate, a source region, and a drain region in contact with the semiconductor layers of the alternating stack.

A first contact metal layer is formed in contact with the source region, and a second contact metal layer is formed in contact with the drain region, at step 2806. One of a first silicide and a first germanide is formed in contact with and surrounding the source region, and one of a second silicide and a second germanide is formed in contact with and surrounding the drain region, at step 2808. A first contact liner is formed on and in contact with the first silicide and the spacer, and a second contact liner is formed on and in contact with the second silicide and the spacer, at step 2810. The control flow then exits at step 2812 where conventional fabrication techniques are performed to complete the fabrication of the nano-sheet semiconductor structure.

Although specific embodiments of the invention have been disclosed, those having ordinary skill in the art will understand that changes can be made to the specific embodiments without departing from the spirit and scope of the invention. The scope of the invention is not to be restricted to the specific embodiments, and it is intended that the appended claims cover any and all such applications, modifications, and embodiments within the scope of the present invention.

It should be noted that some features of the present invention may be used in one embodiment thereof without use of other features of the present invention. As such, the foregoing description should be considered as merely illustrative of the principles, teachings, examples, and exemplary embodiments of the present invention, and not a limitation thereof.

Also, these embodiments are only examples of the many advantageous uses of the innovative teachings herein. In general, statements made in the specification of the present application do not necessarily limit any of the various claimed inventions. Moreover, some statements may apply to some inventive features but not to others.

What is claimed is:

1. A method for forming a vertical fin field-effect-transistor semiconductor structure, the method comprising:
  forming at least one structure comprising at least
    a substrate, at least one semiconductor fin, a first source or drain layer disposed in contact with a lower portion of the at least one semiconductor fin, a gate structure in contact with the at least one semiconductor fin, and a second source or drain layer disposed above the first source or drain layer and further disposed on and in contact with a top surface of the at least one semiconductor fin;

forming a dielectric layer over the at least one structure, wherein when the first source or drain layer is a source layer, the second source or drain layer is a drain layer, and wherein when the first source or drain layer is a drain layer, the second source or drain layer is a source layer;

forming a first contact trench in the dielectric layer exposing a portion of the first source or drain layer, and a second contact trench in the dielectric layer exposing a portion of the second source or drain layer;

forming a first carbon interlayer on and in contact with the exposed portion of the first source or drain layer;

forming a second carbon interlayer on and in contact with the exposed portion of the second source or drain layer;

after forming the first and second carbon interlayers, forming a first contact metal layer on and in contact with the first carbon interlayer, and a second contact metal layer on and in contact with the second carbon interlayer; and forming one of a first silicide and a first germanide in contact with a portion of the first carbon interlayer, and one of a second silicide and a second germanide in contact with a portion of the second carbon interlayer, wherein the one of the first silicide and the first germanide and the one of the second silicide and the second germanide are formed with carbon from the first and second carbon interlayers, respectively.

2. The method of claim 1, further comprising:
forming a first contact liner on and in contact with sidewalls of the first contact trench and the one of the first silicide and the first germanide, and a second contact liner on and in contact with sidewalls of the second contact trench and the one of the second silicide and the second germanide; and forming a first metal contact within the first contact trench in contact with the first contact liner, and a second metal contact in contact within the second contact liner.

3. The method of claim 1, wherein the first source or drain layer comprises at least one of silicon phosphorous, carbon doped silicon carbide, silicon arsenide, carbon doped silicon arsenide, silicon germanium, carbon doped silicon germanium, and a bi-layer of silicon germanium and silicon germanium carbide.

4. The method of claim 1, wherein one or more of the first metal contact layer and the second metal contact layer comprise at least one of titanium, tantalum, titanium nitride, hafnium, zirconium, niobium, and alloys thereof comprising carbon.

5. The method of claim 1, wherein one or more of the first metal contact layer and the second metal contact layer comprise at least one of molybdenum, ruthenium, vanadium, and tungsten.

6. The method of claim 1, further comprising:
forming an additional structure on the substrate comprising at least:
an additional semiconductor fin, a third source or drain layer disposed in contact with a lower portion of the additional semiconductor fin, an additional gate structure in contact with the additional semiconductor fin, and a fourth source or drain layer disposed above the third source or drain layer and further disposed on and in contact with a top surface of the additional semiconductor structure, wherein when the third source or drain layer is a source layer, the fourth source or drain layer is a drain layer, and wherein when the third source or drain layer is a drain layer, the fourth source or drain layer is a source layer, wherein the method further comprises forming the dielectric layer over both the structure and the additional structure.

7. The method of claim 6, further comprising:
forming a third contact trench in the dielectric layer exposing a portion of the third source or drain layer, and a fourth contact trench in the dielectric layer exposing a portion of the fourth source or drain layer;

forming a third carbon interlayer on and in contact with the exposed portion of the third source or drain layer;

forming a fourth carbon interlayer on and in contact with the exposed portion of the fourth source or drain layer;

after forming the third and fourth carbon interlayers, forming a third contact metal layer on and in contact with the third carbon interlayer, and a fourth contact metal layer on and in contact with the fourth carbon interlayer; and forming one of a third silicide and a third germanide in contact with the a portion of the third carbon interlayer, and one of a fourth silicide and a fourth germanide in contact with the fourth carbon interlayer, wherein the one of the third silicide and the third germanide and the one of the third silicide and the third germanide are formed with carbon from the third and fourth carbon interlayers, respectively.

8. The method of claim 6, wherein the third source or drain layer comprises at least one of silicon phosphorous, carbon doped silicon carbide, silicon arsenide, carbon doped silicon arsenide, silicon germanium, carbon doped silicon germanium, and a bi-layer of silicon germanium and silicon germanium carbide.

9. The method of claim 6, wherein one or more of the third contact metal layer and the fourth contact metal layer comprise at least one of titanium, tantalum, titanium nitride, hafnium, zirconium, niobium, and alloys thereof comprising carbon.

10. The method of claim 6, wherein one or more of the third contact metal layer and the fourth contact metal layer comprise at least one of molybdenum, ruthenium, vanadium, and tungsten.

* * * * *